United States Patent [19]
Lang

[11] Patent Number: 6,028,722
[45] Date of Patent: Feb. 22, 2000

[54] OPTICAL BEAM RECONFIGURING DEVICE AND OPTICAL HANDLING SYSTEM FOR DEVICE UTILIZATION

[75] Inventor: Robert J. Lang, Pleasanton, Calif.

[73] Assignee: SDL, Inc., San Jose, Calif.

[21] Appl. No.: 08/614,787

[22] Filed: Mar. 8, 1996

[51] Int. Cl.[7] ........................................... G02B 5/04
[52] U.S. Cl. ............................... 359/834; 359/836
[58] Field of Search ........................... 359/831, 833, 359/834, 835, 836, 837, 129, 861

[56] References Cited

U.S. PATENT DOCUMENTS

| | | | |
|---|---|---|---|
| 2,447,828 | 8/1948 | West | 359/833 |
| 3,360,323 | 12/1967 | Weisman et al. | 359/834 |
| 3,520,595 | 7/1970 | Treuthart | 359/833 |
| 3,584,226 | 6/1971 | Lerner | 359/834 |
| 3,625,587 | 12/1971 | Harrsck | 359/833 |
| 4,428,647 | 1/1984 | Sprague et al. | 350/167 |
| 5,168,401 | 12/1992 | Endriz | 359/625 |
| 5,369,661 | 11/1994 | Yamaguchi et al. | 372/69 |
| 5,418,880 | 5/1995 | Lewis et al. | 385/123 |

FOREIGN PATENT DOCUMENTS

| | | |
|---|---|---|
| 9515510 | 6/1995 | WIPO . |

OTHER PUBLICATIONS

Yamaguchi et al., "Collimation of Emissions From a High Power Multistripe Laser Diode Bar With Multiprism Array Coupling and Focusing to a Small Spot", *Optics Letters*, vol. 20(8), pp. 898–900, Apr. 15, 1995.

W. A. Clarkson et al., "Novel beam Shaping Technique for High Power Diode Bars", *Cleo '94, Summaries of Papers presented at the Conference on Lasers & Electro–Optics*, vol. 8, *1994* Technical Digest Series, May 8–13, 1994.

*Primary Examiner*—Ricky D. Shafer
*Attorney, Agent, or Firm*—W. Douglas Carothers, Jr.

[57] ABSTRACT

A beam reconfiguring device comprises a single prism element that reconfigures a beam input, such as from a semiconductor laser or bar array, having aperture images with major axis aligned abreast along a single axis, into an output comprising multiple segments of the input image with a major axis of each segment aligned perpendicular along the same single axis. The etendue, the aperture-times-divergence product of a beam, in orthogonal directions of the output beam will be more nearly equal than the etendue in orthogonal directions of the input beam. The input beams and reconfigured beams are provided as adjacent inputs to a hypotenuse front edge surface of the prism element. The reconfigured beams are more conducive for converging into a single substantially symmetrical spot for input to an optical handling device or medium such as an optical fiber. An optical handling system is disclosed for achieving straight in-line, beam input/output that is more adaptable for optically aligned delivery applications. While a single prism element is readily conducive to the practice of the invention, the reflecting surfaces for reconfiguring the beam may also be a plurality of reflecting surfaces spatially disposed in proper alignment to accomplish the same desired reconfigured output beam.

39 Claims, 15 Drawing Sheets

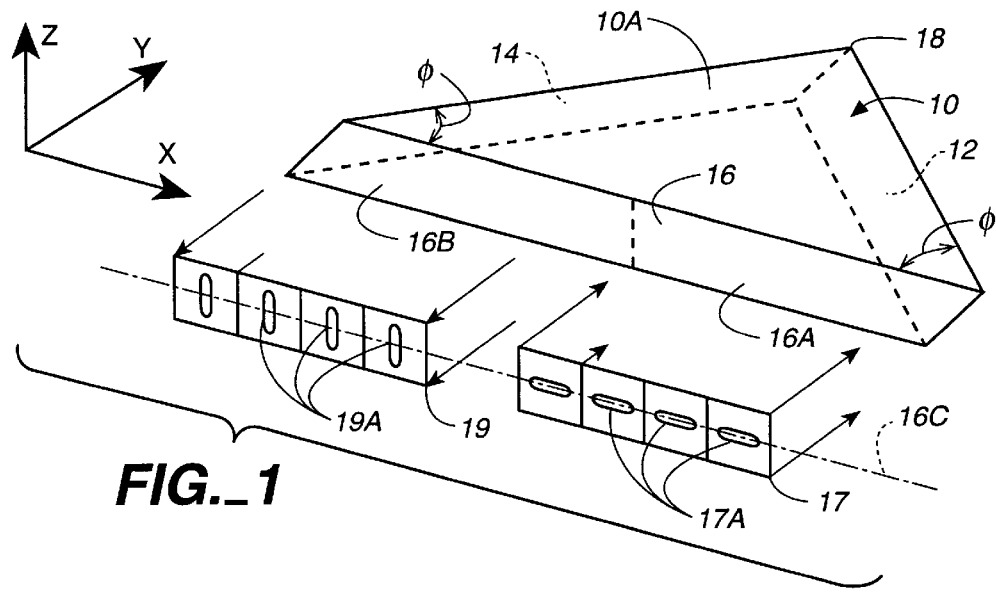
FIG._1
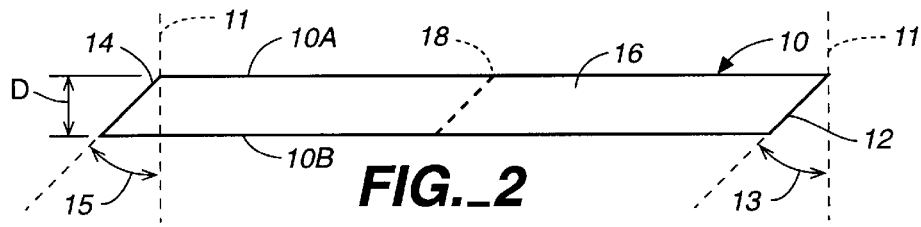
FIG._2
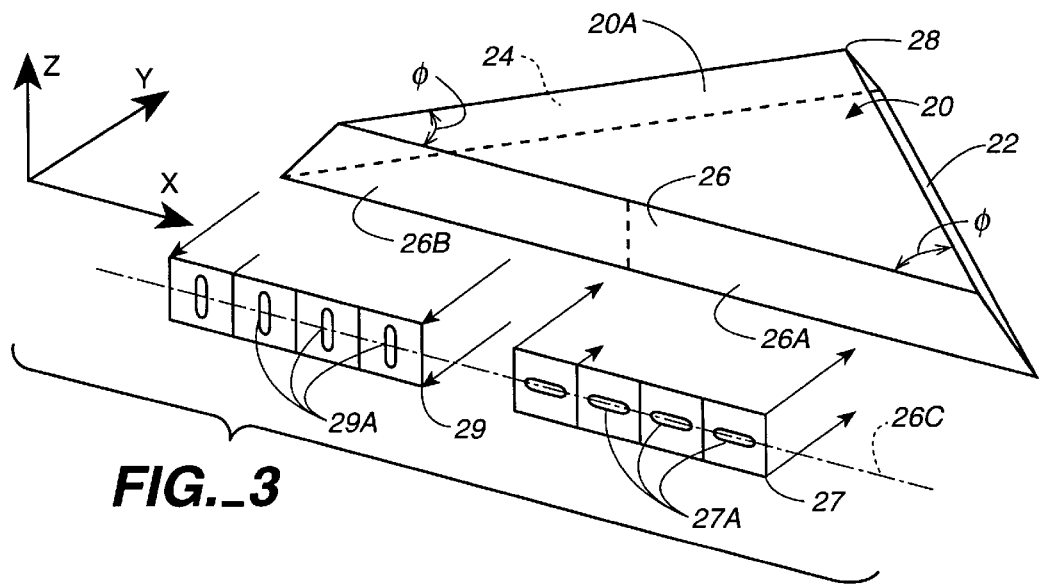
FIG._3
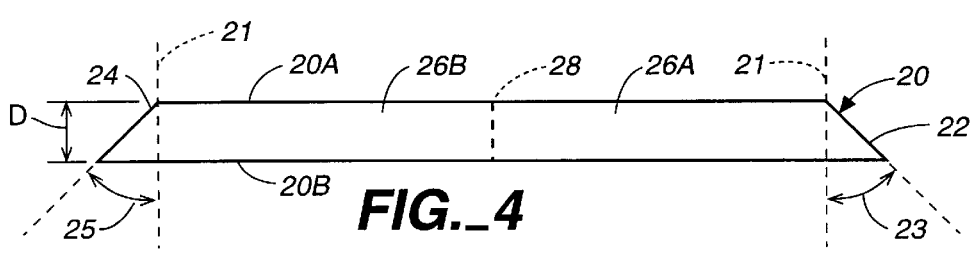
FIG._4

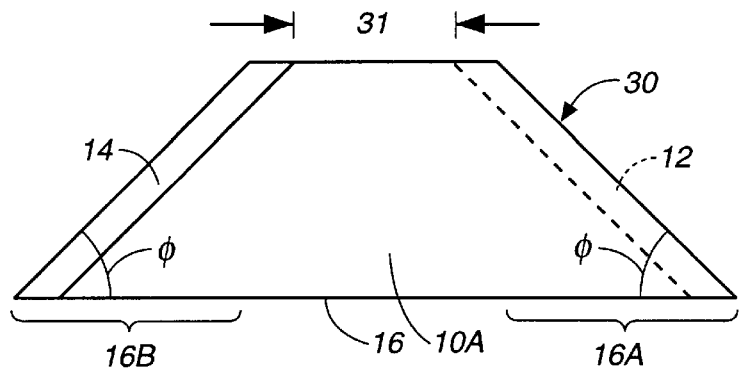
FIG._5
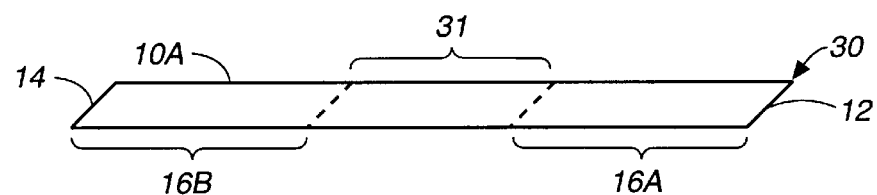
FIG._6
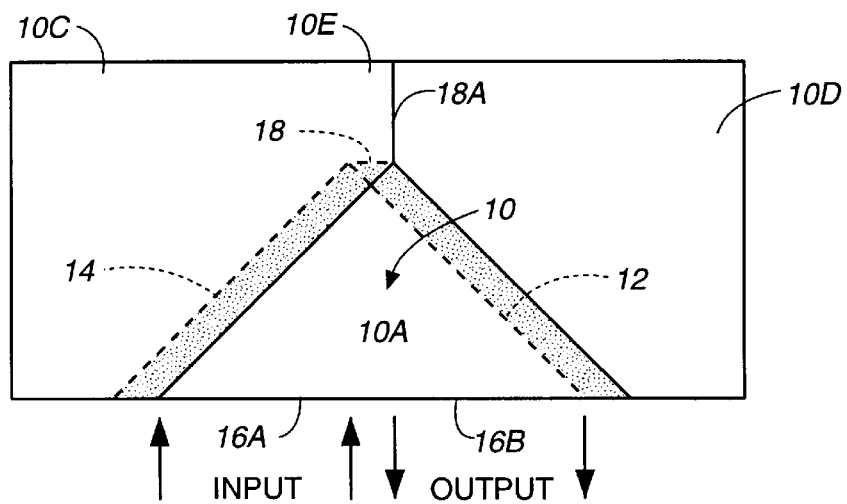
FIG._7
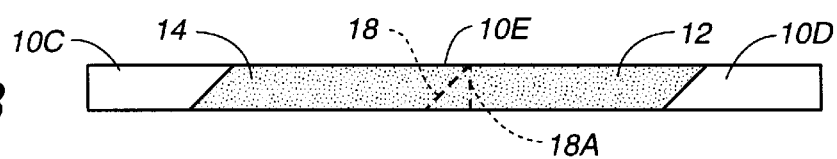
FIG._8

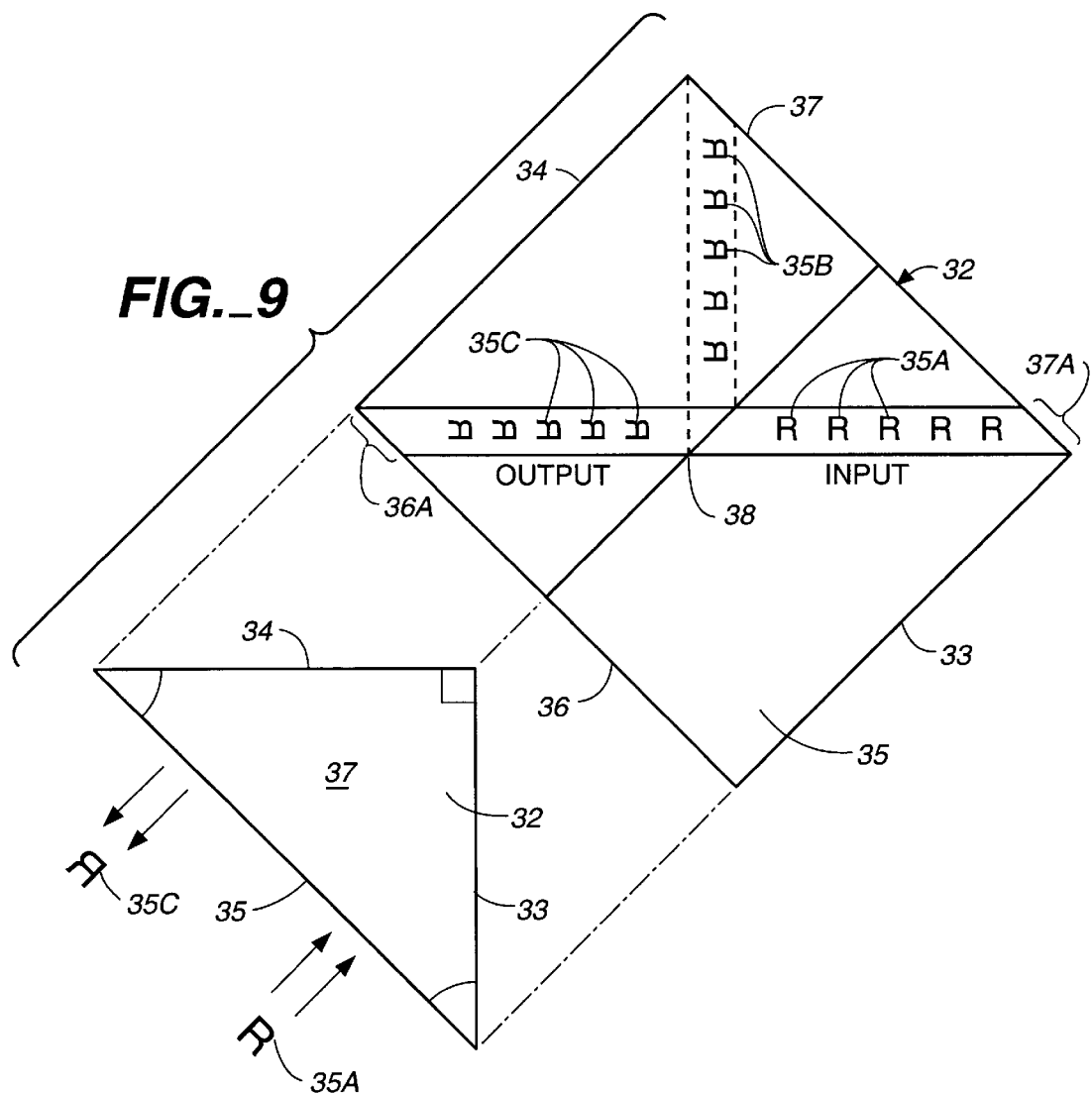

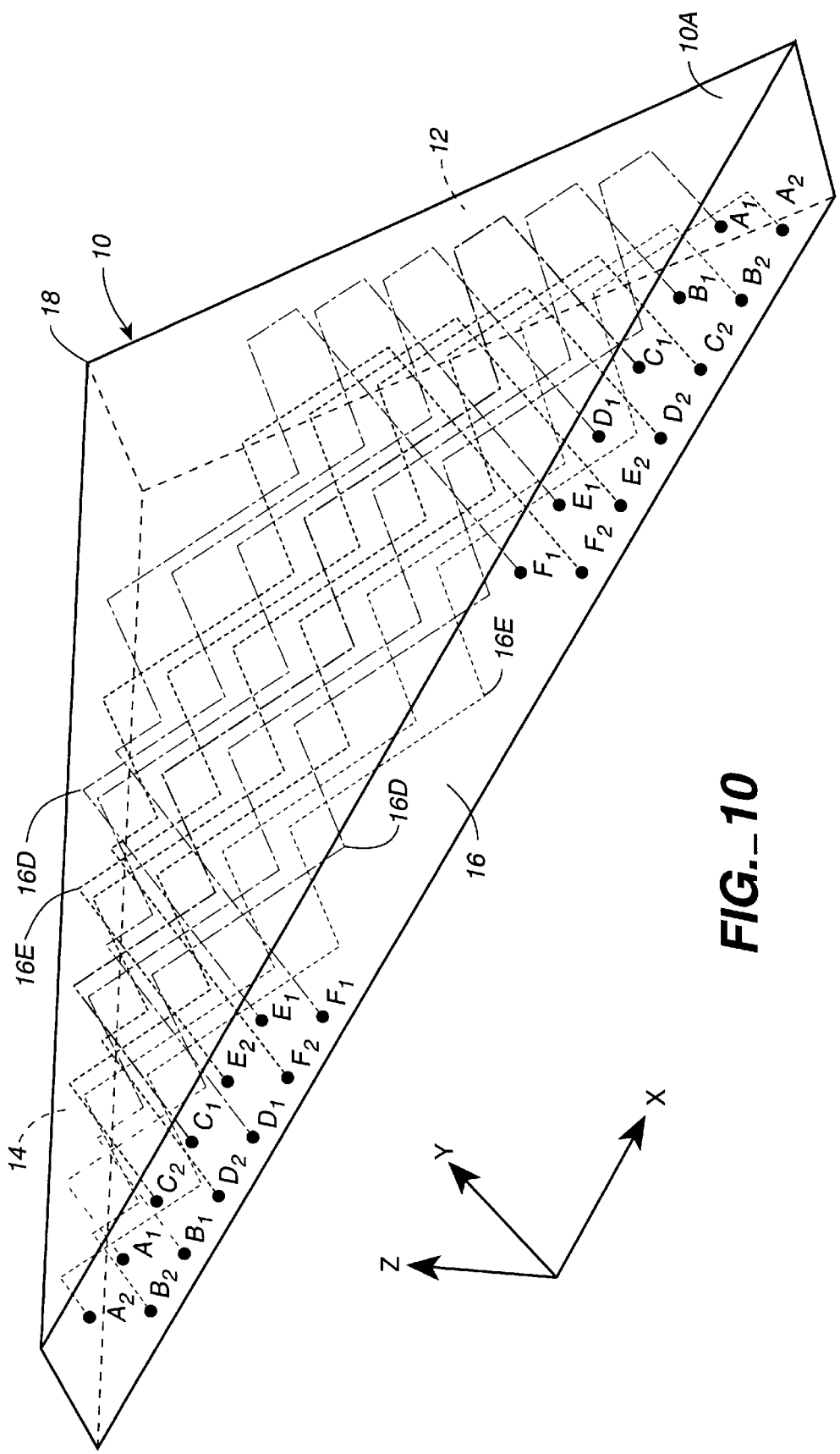
FIG._10

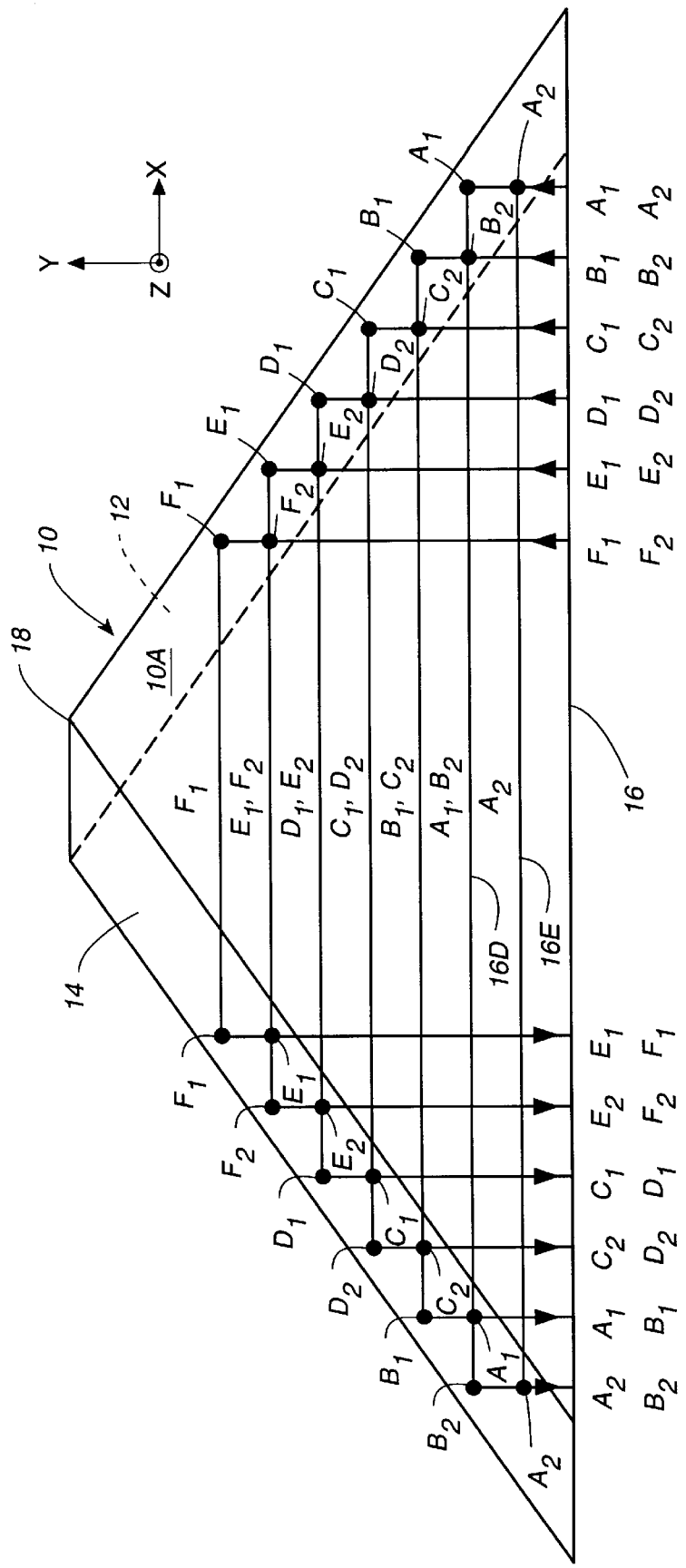
FIG._11

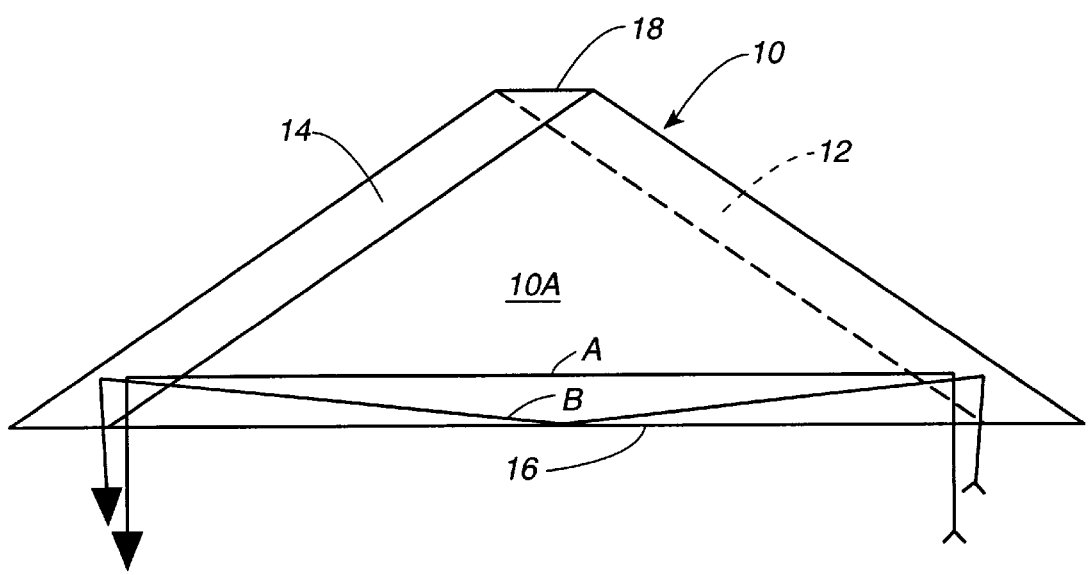
FIG._11A

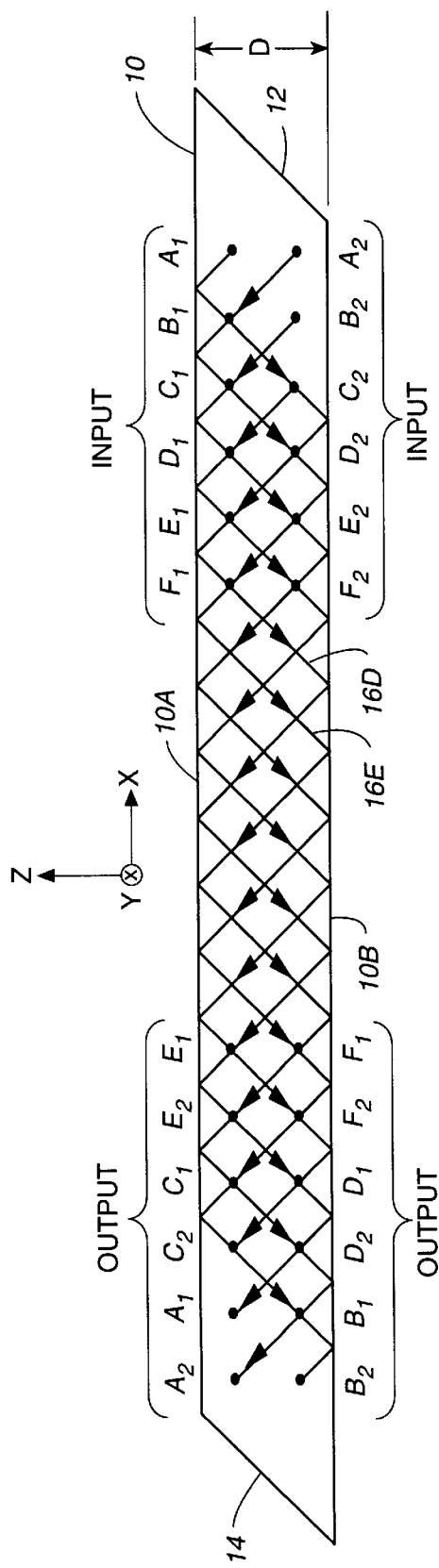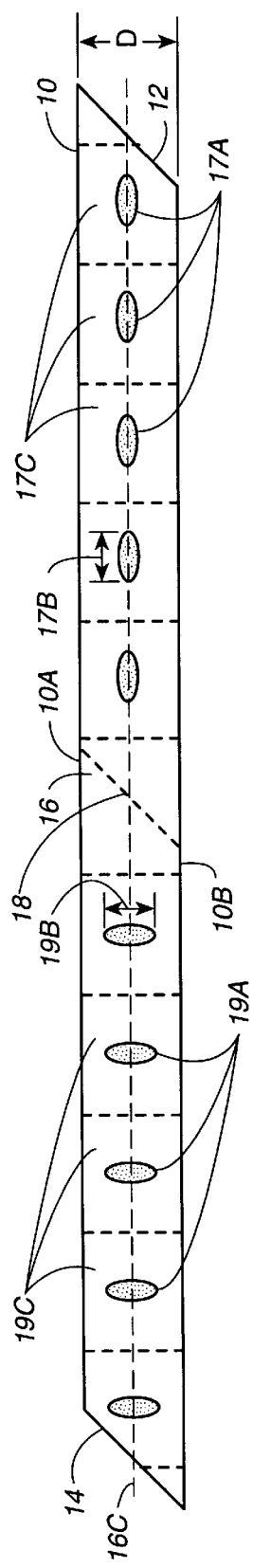
FIG._12
FIG._13

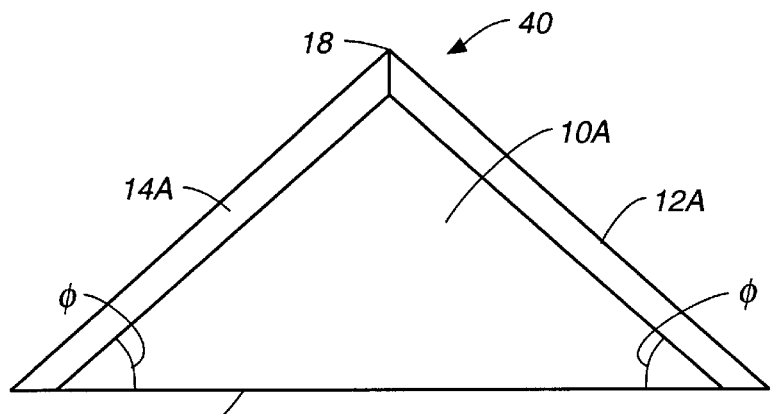
FIG._14
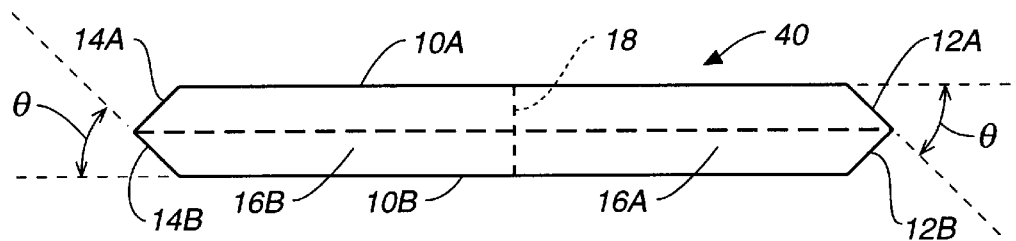
FIG._15
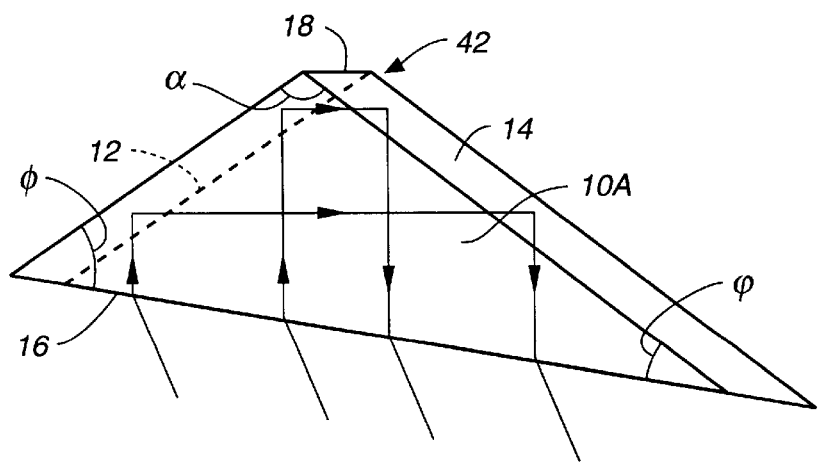
FIG._16

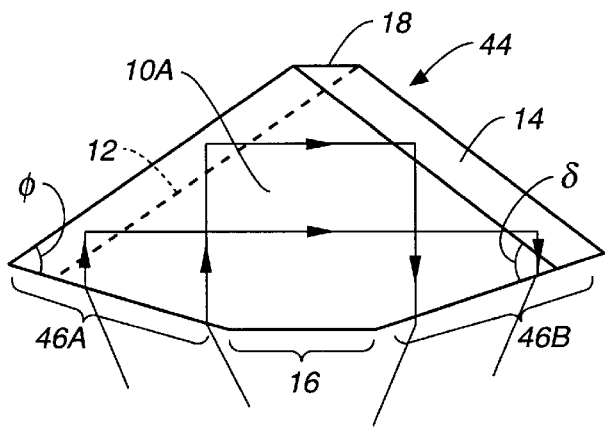
FIG._17
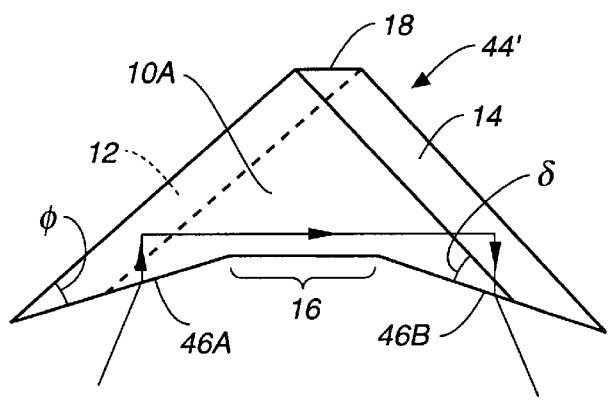
FIG._17A
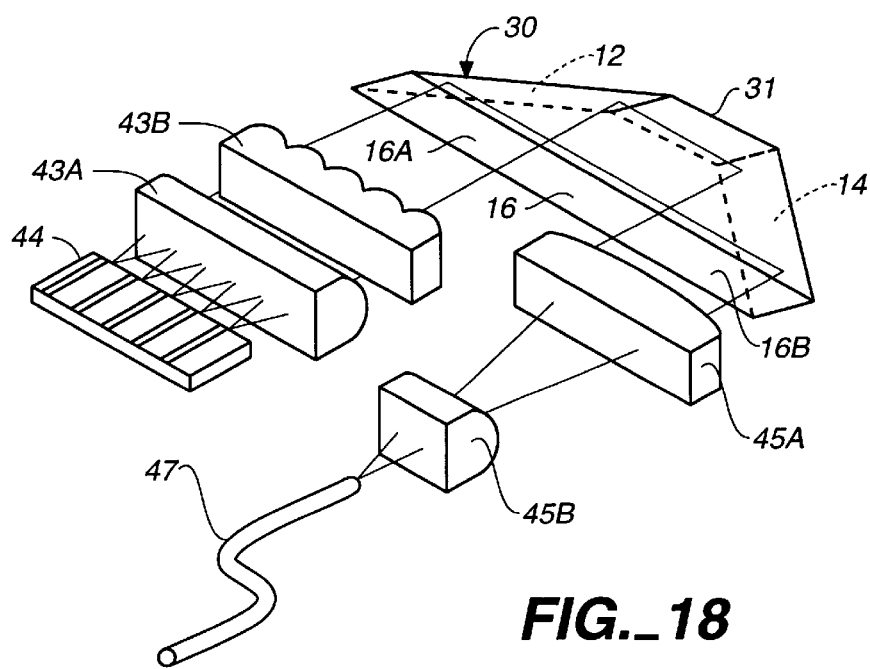
FIG._18

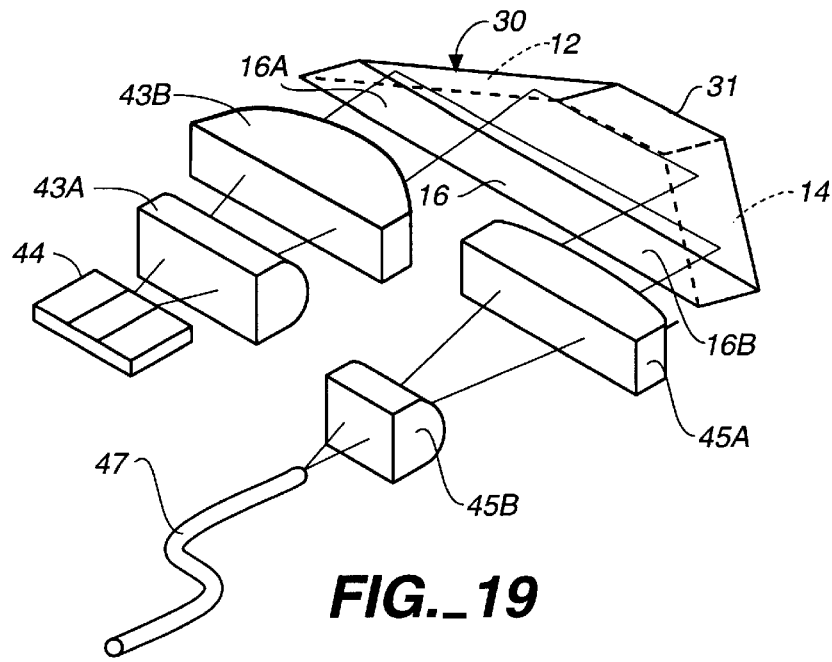
FIG._19
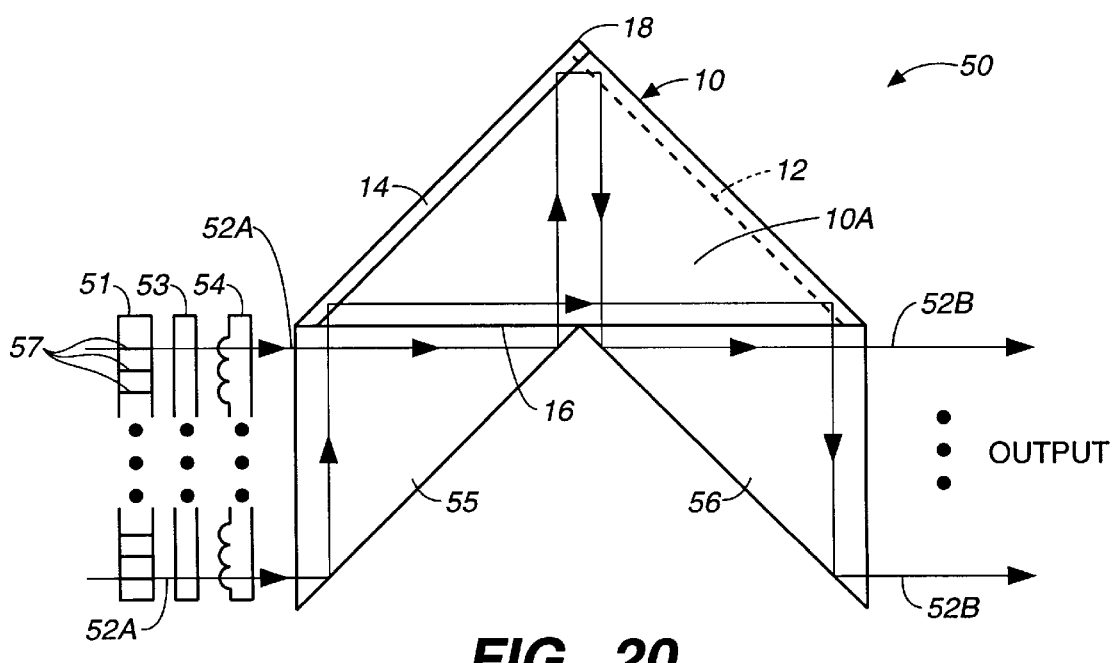
FIG._20

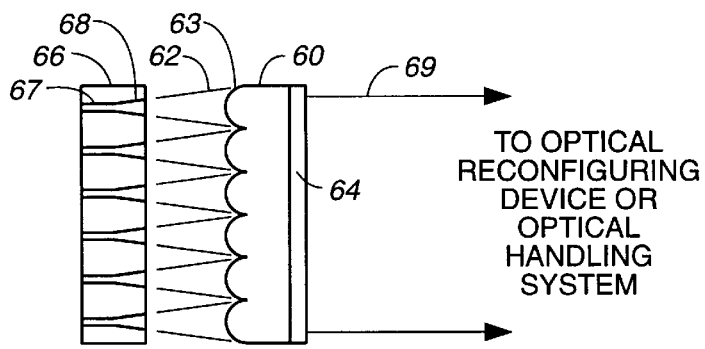
FIG._21
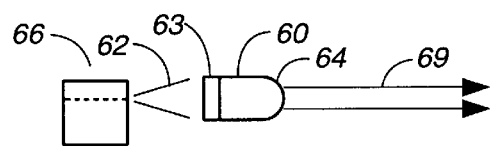
FIG._22
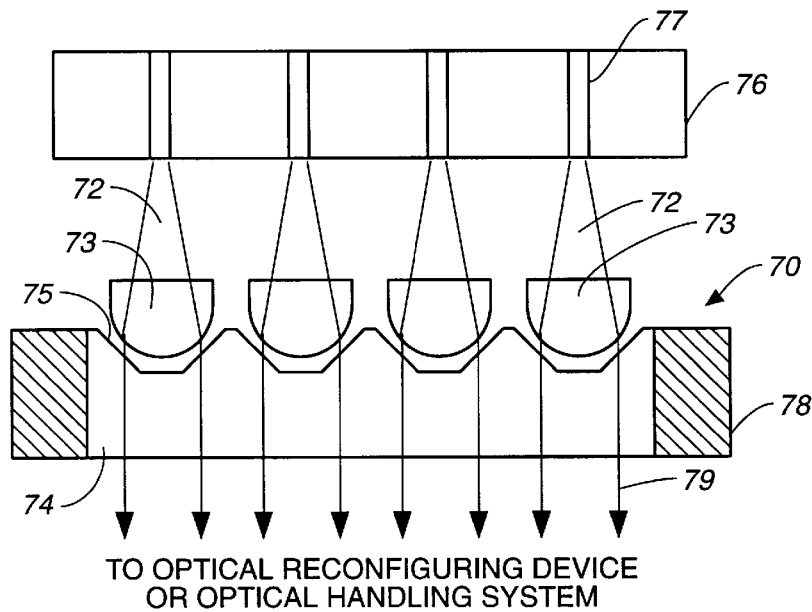
FIG._23
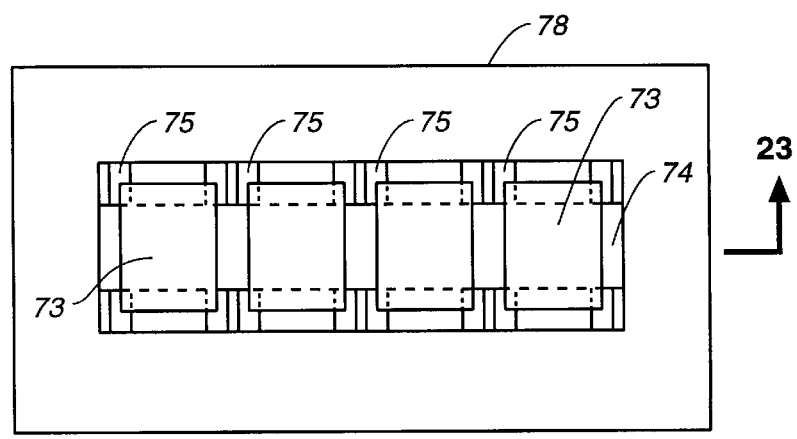
FIG._24

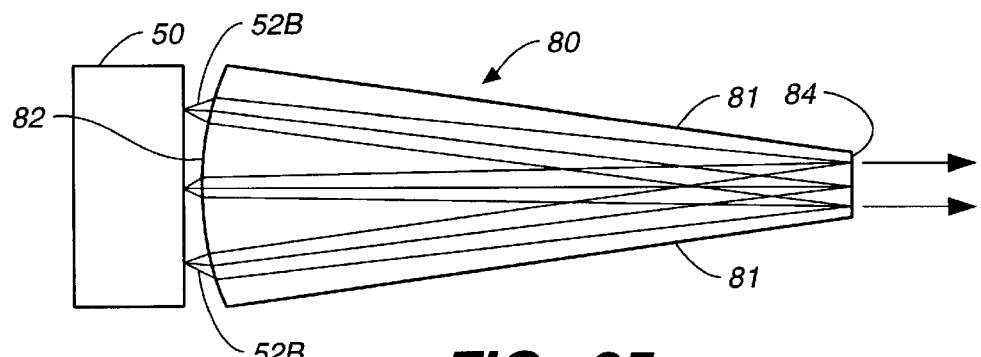
FIG._25
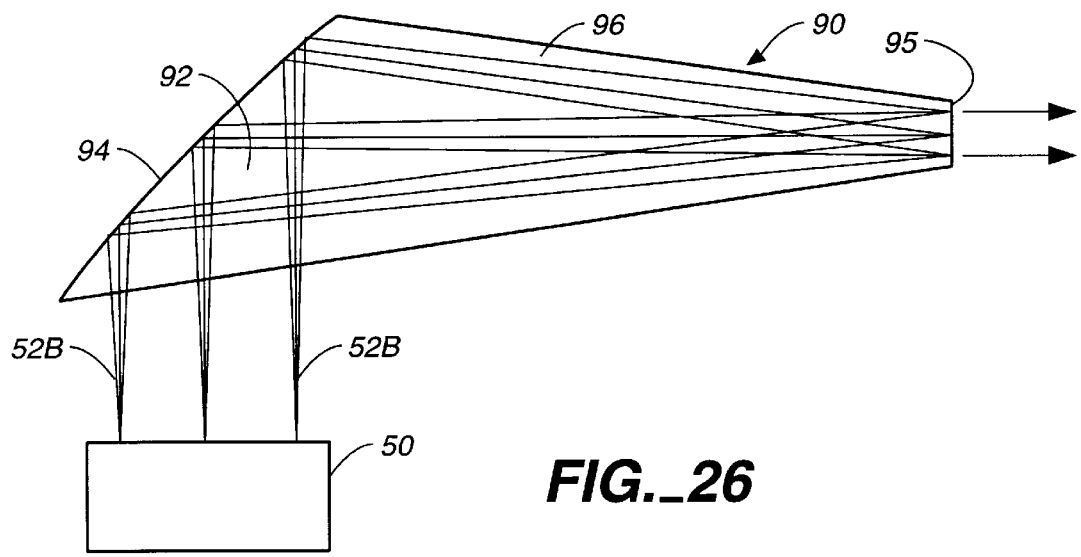
FIG._26
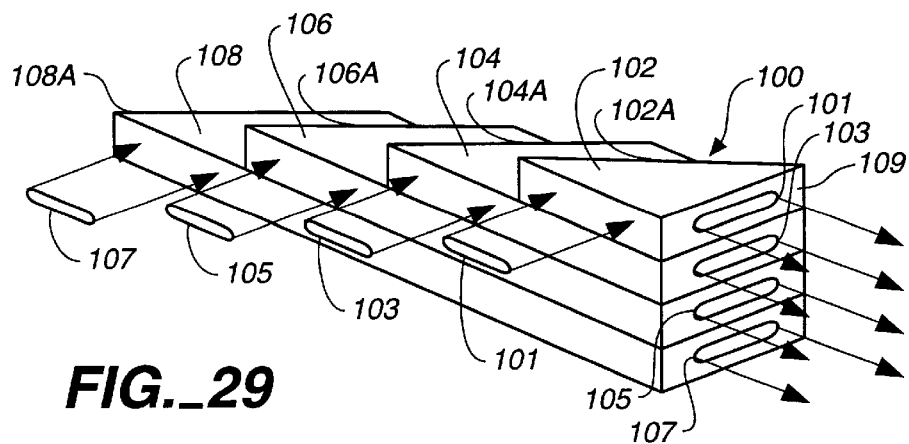
FIG._29

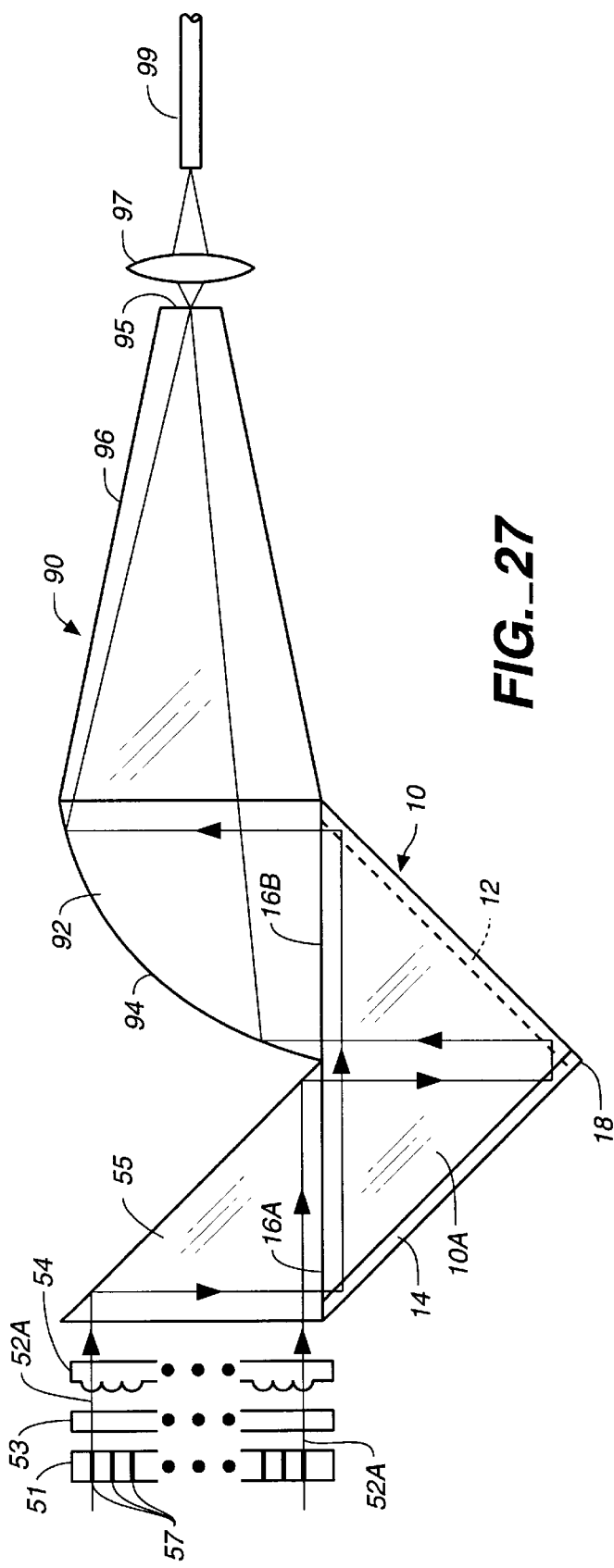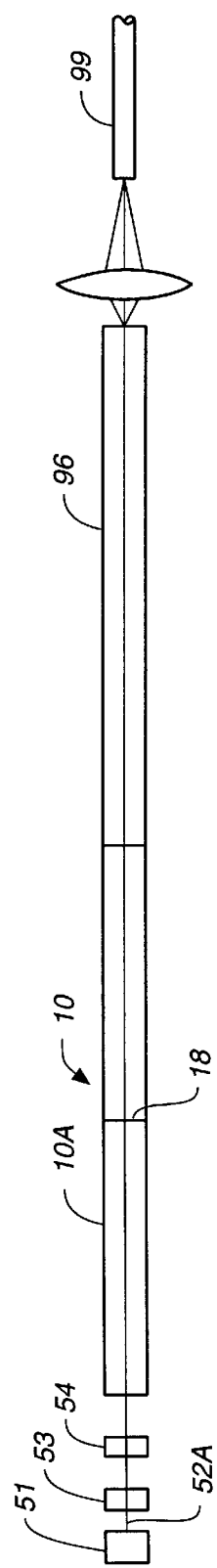

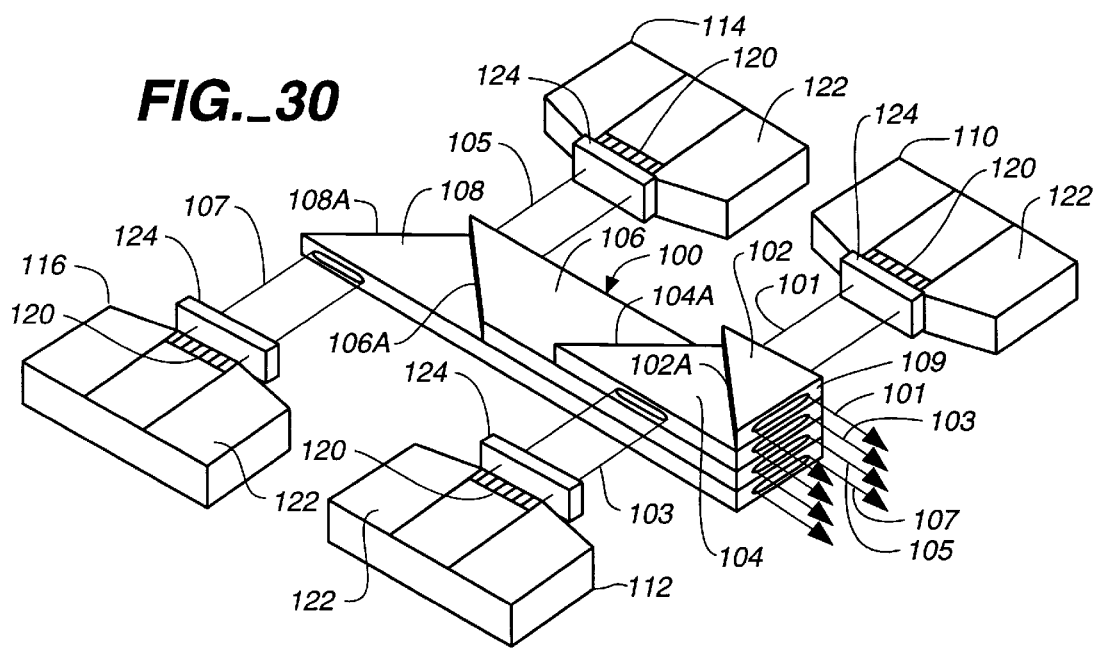
FIG._30
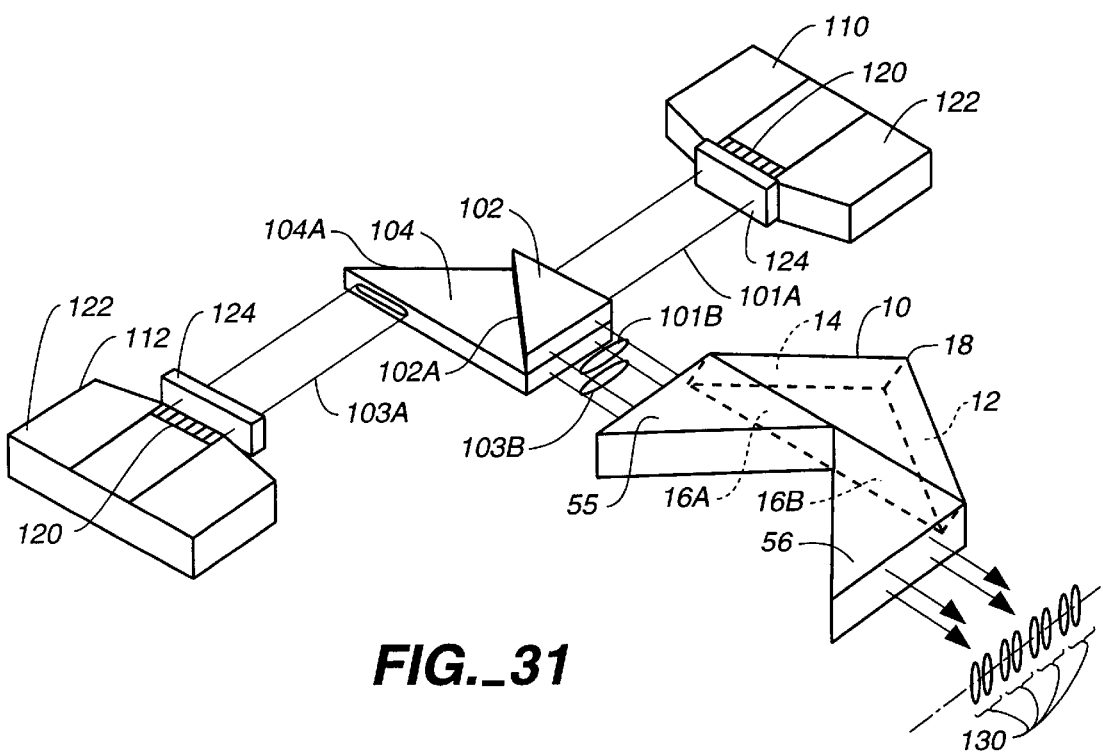
FIG._31

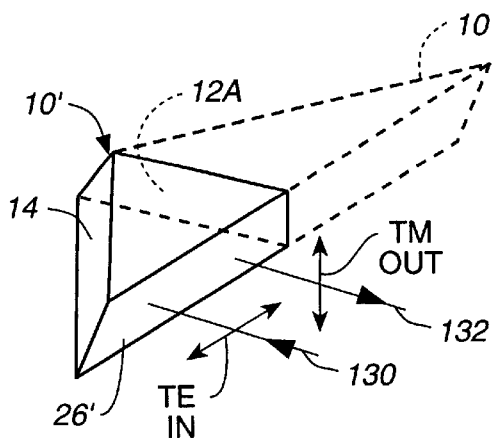
FIG._32
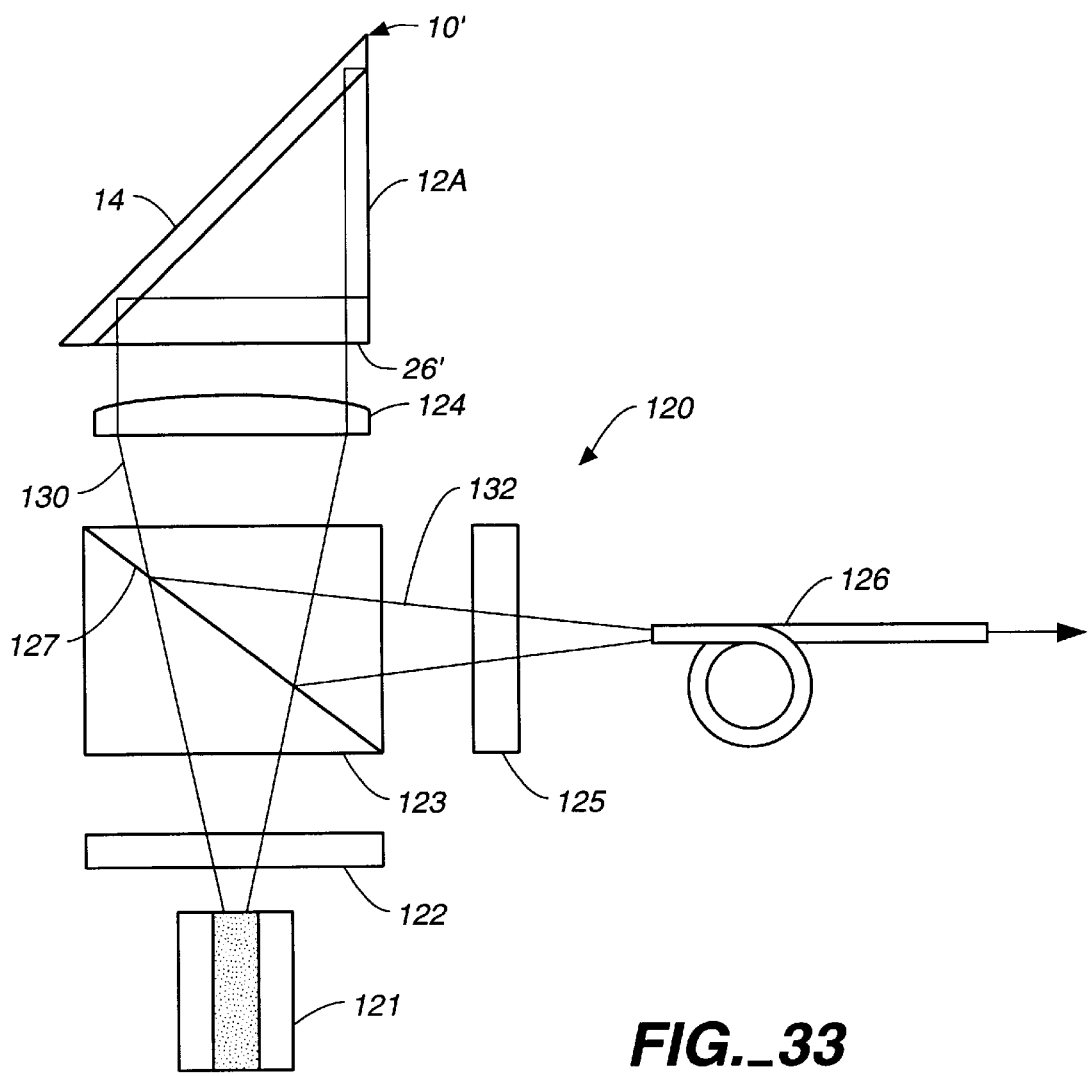
FIG._33

OPTICAL BEAM RECONFIGURING DEVICE AND OPTICAL HANDLING SYSTEM FOR DEVICE UTILIZATION

FIELD OF THE INVENTION

This invention relates generally to a device for reconfiguring a radiation beam from an asymmetric radiation source and more particularly to a single prism optical system for reorienting a radiation beam from a single or plural beam source having highly asymmetric diffraction properties to a single or beam having more nearly symmetrical diffraction properties that can be readily focused with conventional optics into a more nearly circular spot size with a more nearly circular numerical aperture of an optical handling medium or device such as an optical fiber, waveguide or solid state laser.

The basic problem with coupling the optical output of a multiple emitter radiation source to an aperture limited waveguide device, such as an optical fiber, is that of coupling asymmetry: how to efficiently provide delivery of substantial optical power from a source comprising one or more semiconductor laser elements that provides a beam having a large aperture-times-divergence product aspect ratio to a small substantially orthogonally symmetrical spot acceptable to the input aperture of an optical handling medium or device which receives delivery of the reconfigured optical beam. In the case of an optical device such as an optical fiber, the spot size of the focused beam must be equated to its input diameter and its acceptance angle (numerical aperture) in two orthogonal directions. Since the orthogonal divergence angles and aperture dimensions of the output beam from a semiconductor laser array are different in the lateral and transverse directions, it is difficult to simultaneously achieve a beam with the same spot size and divergence in orthogonal axes suitable for optically symmetrical applications requiring high optical power, such as focusing to meet the numerical aperture requirements of an optical fiber.

The laser array emitters or apertures of laser bars have a greater length in the lateral orthogonal direction compared to the transverse orthogonal direction. These orthogonal directions relative to the laser array are defined and discussed in U.S. Pat. 5,168,401 to Endriz, which is assigned to the assignee herein and is incorporated herein by reference thereto. In particular, it is customary in the laser diode art to define the lateral direction as an axis in a horizontal plane that is perpendicular to the optical axis or axes of a laser diode or multi-emitter diode array. The transverse direction is also parallel to this horizontal plane as well as perpendicular to the optical axis but is also perpendicular to the lateral direction and, therefore, can be characterized as falling in a vertical plane cutting through the optical axis of the laser diode. The longitudinal direction is in the horizontal plane and parallel with the optical axis but perpendicular to both the lateral transverse directions.

The output beam from a laser or laser array can be characterized by the transverse and lateral etendues, where the transverse etendue is the product of the aperture and divergence in the transverse direction and the lateral etendue is the product of the aperture and divergence in the lateral direction. The emitting region of common lasers or laser arrays is typically many times larger in one direction than in the other, e.g., by a factor of 100 or more, while the divergences are usually similar, e.g., within a factor of three of each other. As a result, the etendue aspect ratio, i.e., the ratio of the lateral and transverse etendues, is commonly 100:1 or higher.

On the other hand, the optical handling medium or device to which the output beam from the laser array is to be delivered usually has substantially symmetric orthogonal etendues, such as a circular or square cross-section with the same divergence angle in each orthogonal axis. Therefore, an optical coupling system must be devised to deliver the output of the laser array to the optical handling medium or device input with substantial symmetry but without substantial loss of total power or beam brightness, where brightness is defined as the ratio of the total power and the product of the transverse and longitudinal etendues.

Multiple beam shaping or reconfiguration is generally designed to produce two different kinds of changes: (1) by changing the beam profile to have a symmetrical Gaussian distribution and/or (2) by altering the etendues of the beam in orthogonal directions of propagation to form a substantially symmetrical beam of small numerical aperture. U.S. Pat. No. 5,168,401 to Endriz accomplishes the latter by means of a multi-reflecting surface device and plano-convex lenslets to individually reorient multiple beams from the laser array by, for example, 90° rotation, and to collimate the beams so that they can be more easily re-imaged through focusing optics to a symmetrical spot size adaptable for input to an optical handling medium or device. Each beam, initially parallel with the transverse axes of the beam aperture output, is rotated by the reflective element by 90° and the plural beams emerge from the reflective array with their lateral beam aperture axes aligned parallel with one another. The beams are then in a much better configuration for collection and convergence via focusing optics, to a substantially symmetrical, diffraction limited spot size. Another example of the same type of reorientation of multiple output beam sources is disclosed in U.S. Pat. No. 5,418,880 to Lewis et al. wherein the individual asymmetric output beams from the laser array are rotated and collected by asymmetric and focusing optics to produce a symmetrical spot size adaptable for input to a double clad fiber.

Another type of optical coupling system is directed to re-image the emitter outputs of the laser array by optical reducing or increasing one beam axis of the respective beams relative to the other orthogonal beam axis in order to reformat their high aspect ratio output. Examples of this approach are disclosed in U.S. Pat. No. 4,428,647 to Sprague et al. and U.S. Pat. No. 5,369,661 to Yamaguchi et al.

An improved attempt toward providing a solution to the problem is disclosed in the article of Yamaguchi et al. entitled, "Collimation of Emissions From a High Power Multistripe Laser Diode Bar With Multiprism Array Coupling and Focusing to a Small Spot", Optics Letters, Vol. 20(8), pp. 898–900, Apr. 15, 1995. The optical coupling system disclosed comprises a plurality of oblique (dove) prism elements that are secured together in an array, one prism element for each output beam of the laser array. Each beam enters one face of the prism and is internally reflected three times to emerge from another face of the prism. Each beam is reoriented in that the beam is rotated by 90° within the prism and the plural beams emerge from the prism array with their lateral beam axes parallel with one another. The beams are then in a much better configuration for collection and convergence via asymmetric and focusing optics, to a substantially symmetrical, diffraction limited spot size. This configurational approach is similar to U.S. Pat. No. 5,168,401 to Endriz except that, in Yamaguchi et al., the individual output beams emerge from the dove prism array in substantially the same plane as the entry plane of the original laser array beams directed into the prism array. This is one of the reasons why Yamaguchi et al. has three optical surfaces, while Endriz has only two reflection surfaces, in order to reorient the output beam array in same direction as its original input. The problem with this system approach is providing high yield production of a fairly complex prism structure requiring labor intensive fabrication and resulting high cost production.

A more recent attempt toward providing a solution to the problem is disclosed in PCT international application No. PCT/GB94/02614 to Clarkson et al., published as WO 95/15510 on Jun. 8, 1995. The optical coupling system disclosed comprises two mirror plates 22, 24 properly spaced from one another as well as positionally offset from one another and angularly inclined in two orthogonal axes with respect to the optical beam. The Clarkson et al. approach provides for reduction of the diffraction limited capability in one orthogonal direction where the beam has large divergence (transverse direction) while increasing the diffraction limited capability in the other orthogonal direction (lateral direction) where the beam has small divergence. The Clarkson et al. approach is complicated by angular adjustments in combination with precision lateral displacement of two mirror plates and adjustments of angular beam displacements in two orthogonal directions relative to angular entry of beams into the properly aligned mirror plates. The Clarkson et al. approach is further complicated by the change of the overall orientation of the beam from a predominately horizontal orientation to a predominantly vertical orientation and by the need to angularly displace the pair of plates from both the horizontal and vertical axes of the optical beam. Due to all of these different parameters to calibrate and check against one another, the fabrication of the device is labor intensive providing limited production capability, resulting in a high cost structure.

What is needed in this area of art is a simpler optical coupling system that utilizes a single optical body element to equalize the lateral and transverse etendues of a beam while maintaining the overall brightness of the beam and its total power.

It is another object of this invention to reconfigure the etendue of the beam without substantially altering the dimensions of the beam.

It is a further object of this invention to provide an optical coupling system for reconfiguring an asymmetric etendue output from one or more laser sources while achieving brightness equalization without substantial optical power losses and without a decrease of overall beam brightness.

It is another object of this invention for coupling a high power radiation source, such as a semiconductor laser array, with an optical handling medium or device, such as an optical waveguide, optical fiber, or solid state laser.

It is a further object of this invention to reconfigure a single beam or plural beams from an asymmetric radiation source to transform the transverse intensity profile from one having highly asymmetric diffraction properties to a beam having substantially symmetrical diffraction properties that can be readily focused with conventional optics into a substantially circular spot with small but substantially the same or similar divergence in orthogonal directions that fits the numerical aperture of optical delivery systems such as optical fibers.

SUMMARY OF THE INVENTION

According to this invention, a beam reconfiguring device comprises a single prism element that reconfigures the beam input from a laser source, such as a semiconductor laser diode or laser array, into an optical output with substantially symmetrical etendues. The beam is reconfigured by a combination of displacement, redistribution and reorientation of portions of the original beam within the confines of a single prism element via four or more internal reflecting surfaces. In particular, the beam rays are both clipped or partitioned into beam portions referred to as segments which are laterally displaced and are rotated by 90°, which we define as beam reconfiguration. Therefore, the final output beam from the beam reconfiguring device is not the same as the original input beam but is reconfigured from portions of the original beam. An input beam comprising a plurality of original input beams with each beam having an asymmetric beam aperture image, i.e., of high aspect ratio with major and minor orthogonal axis, is presented to an input face or surface of the beam reconfiguring device with beam major axes aligned in a first direction along a common axis. The resulting output beam from the beam reconfiguring device is provided at an output face or surface as an array of segments with beam major axes of each segment aligned parallel in a second direction perpendicular to the first direction with respect to the aforementioned common axis. Also, the etendue, the aperture-times-divergence product of a beam, in orthogonal directions of the output beam will be more nearly equal than the etendue in orthogonal directions of the input beam. The prism element, therefore, provides for reorientation of the input light in manner more conducive for subsequent converging and focusing to a symmetrical spot for optical delivery, for example, to an optical fiber, while substantially conserving the brightness of the original input beams.

In particular, the beam reconfiguring device of this invention comprises a prism device having a prism configuration wherein the hypotenuse front edge surface of the prism functions both as a beam input surface and a reconfigured beam output surface. The prism device has a plurality of reflecting surfaces defining a plurality of different propagation ray paths for these beams internally through the prism device. One set of the reflecting surfaces are the major opposite planar surfaces of the prism and the other set of reflecting surfaces are the lateral side edge surfaces of the prism each with one end coupled to the hypotenuse front edge surface. The other ends of the lateral side edge surfaces may be coupled at an apex or separated by a distance. The lateral side edge surfaces are substantially at a 45° angle with respect to the front hypotenuse front edge surface and 90° at their apex, but are disposed at an angle relative to the parallel planes of the major opposite planar surfaces of the prism. The angles of the two lateral edge surfaces may be the same, i.e. 60° relative to the top surface or both 120° or, alternatively, one 60° relative to the top surface and the other—120° relative to the top surface, i.e., the latter is a complement of the former. One or both of the lateral side edge surfaces may be replaced by a pair of surfaces at 60° and 120° respectively. The angular relationship, however, of the lateral side edge surfaces need not be at 60° relative to the planar surfaces, as other angular relationships are also operative to reconfigure the radiation rays on the input beams. In any case, in either type of lateral side edge angular configuration, the beams entering the prism reconfiguring device are dissected into beam segments, due to optical ray paths of the beams being directed along different propagation paths of different lengths within the confines of the prism, i.e., within the dimensional thickness of the prism element, concurrently with rotation of the dissected beam segments. As a result, the beam segments are reconfigured from many portions of the original beam forming a new beam having a beam divergence different from the original beam divergence but with substantially the same beam dimension and is more adaptable for converging and focusing into an optical handling system requiring a symmetrical input beam configuration.

The output of the present invention differs from that produced by Clarkson et al. in the reconfiguration of the output beam from the input beam. In Clarkson et al., the beamlets are stacked in a vertical alignment without rotation whereas, in the present invention, they are aligned horizontally and are also rotated. Further, the present invention utilizes at least one additional reflective surface which is angularly disposed relative to parallel reflecting surfaces between which the input beam propagates so that the etendue in orthogonal directions of the resulting output beam will be more nearly equal than the etendue in orthogonal directions of the original input beam. In this regard, in Clarkson et al., rays that propagate at small angles to the optical axis of propagation may miss the output aperture, resulting in a loss of brightness, while in the present invention, additional reflecting surfaces employed capture these reflection rays propagating at small angles to the optical axis.

Since the beam reconfiguring prism device provides an output from the same surface as its input, an optical beam handling system can be formed using the beam reconfiguring device to provide an in-line, beam input/output that is more adaptable for optically aligned delivery applications. Also, disclosed are optical systems for optically modifying either the beam input to or the beam output from the beam reconfiguring prism device of this invention.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a perspective view of a first embodiment of a beam reconfiguring device of this invention.

FIG. 2 is a frontal elevation of the beam reconfiguring device shown in FIG. 1.

FIG. 3 is a perspective view of a second embodiment of a beam reconfiguring device of this invention.

FIG. 4 is a frontal elevation of the beam reconfiguring device shown in FIG. 3.

FIG. 5 is a planar view of a modified form of the device shown in FIG. 1, which modified form is equally applicable to the embodiment of FIG. 3.

FIG. 6 is a frontal elevation of the beam reconfiguring device shown in FIG. 5.

FIG. 7 is a plan view of a modified form of the device shown in FIG. 1 in which two reflective surfaces of the prism are embedded.

FIG. 8 is a frontal elevation of the complementary piece arrangement shown in FIG. 7.

FIG. 9 is a schematic illustration for explaining the derivation of the beam reconfiguring device.

FIG. 10 is a perspective view of the first embodiment of the beam reconfiguring device of this invention shown in FIG. 1 for the purposes explaining the ray operation of the beam reconfiguring device via ray tracing.

FIG. 11 is a plan elevation of the device shown in FIG. 10 for explaining the radiation ray operation of the beam reconfiguring device via ray tracing.

FIG. 11A is a modified form of the plan elevation of FIG. 11 for explaining the radiation ray operation of the beam reconfiguring device relative to rays with small angle deviation from the optical axis of the primary rays shown n FIGS. 10, 12 and 13.

FIG. 12 is a frontal elevation of the device shown in FIG. 10 for explaining the radiation ray operation of the beam reconfiguring device via ray tracing.

FIG. 13 is a frontal elevation of the device shown in FIG. 10 illustrating the resulting reconfigured beams per the ray tracing shown in FIGS. 10–12.

FIG. 14 is a planar view of a fourth embodiment of a beam reconfiguring device of this invention.

FIG. 15 is a frontal elevation of the beam reconfiguring device shown in FIG. 14.

FIG. 16 is planar view of a fifth embodiment of a beam reconfiguring device of this invention.

FIG. 17 is planar view of a sixth embodiment of a beam reconfiguring device of this invention.

FIG. 17A is a planar view modification of the sixth embodiment shown in FIG. 17.

FIG. 18 is a perspective view of the employment of the beam reconfiguring device of FIG. 1 in an optical handling system using a multiple beam source.

FIG. 19 is a perspective view of the employment of the beam reconfiguring device of FIG. 1 in an optical handling system using a single beam source.

FIG. 20 is a seventh embodiment of this invention illustrating an optical delivery system utilizing the beam reconfiguring device according to this invention.

FIG. 21 is a plan view of a first embodiment of a pre-lens system for quasicollimating the output beams from a beam source for coupling into the beam reconfiguring device of this invention.

FIG. 22 is a side elevation of the plan view shown in FIG. 21.

FIG. 23 is a plan view of a second embodiment of a pre-lens system for quasi-collimating the input beam to the beam reconfiguring device of this invention.

FIG. 24 is a side elevation of the plan view shown in FIG. 23.

FIG. 25 is a plan view of a first embodiment of a post-lens system for converging and focusing the output beam from the beam reconfiguring device of this invention.

FIG. 26 is a plan view of a second embodiment of a post-lens system for converging and focusing the output radiation from the beam reconfiguring device of this invention.

FIG. 27 combines the pre-lens of FIG. 23 with the optical delivery system of FIG. 20 and the post-lens system of FIG. 26.

FIG. 28 is a side elevation of the plan view shown in FIG. 27.

FIG. 29 is a perspective view of a first embodiment of an optical system for providing a plurality of semiconductor laser array beams in a vertically stacked configuration.

FIG. 30 is a perspective view of a second embodiment of an optical system for providing a plurality of semiconductor laser array beams in a vertically stacked configuration.

FIG. 31 is a perspective view of a version of the first embodiment shown in FIG. 29 illustrating the stacked array beams as input radiation to the beam reconfiguring device of this invention.

FIG. 32 is a modified device formed from the beam reconfiguring device of the first embodiment shown in FIG. 1.

FIG. 33 is schematic view of an application of the modified device shown in FIG. 32 in an optical system.

PREFERRED EMBODIMENTS OF THE INVENTION

Reference is now made to FIGS. 1 and 2 illustrating a first embodiment of this invention. Beam reconfiguring device 10 comprises a prism element that is triangular in shape and having major opposite planar surfaces 10A, 10B, lateral side edge surfaces 12 and 14 and a hypotenuse front edge surface 16. Device 10 is made of glass or any other suitable optical material with an index of n>1.414. Lateral side edge surfaces 12 and 14 have one end that meet together to form an angle of 90° at apex 18, and another end that meet with hypotenuse front edge surface 16 at a dihedral angle of 45°. The top surface angle, φ, between surfaces 14 and 16 in the plane of surface 10A may be various different angles but, in the embodiment here, is 35.26°. Lateral edge surfaces 12 and 14 are disposed at angles of 60° and 120° relative to the planar extent of major surfaces 10A, 10B. Thus, as shown in FIG. 2, surfaces 12 and 14 are disposed at angles 60° and 120° relative to axis 11 which is normal to the planes of major surfaces 10A, 10B. Side edge surfaces 12 and 14 form angles 13 and 15 were they meet surface 16. In the particular example here, angles 13 and 15 are both shown at 45°. However, in this embodiment, the angular disposition of angle 13 is identical to angle 15. Other combination of angles of lateral side edge surfaces 12, 14 are possible that provide the desired function.

A beam ray entering input surface 16A of prism device 10 will internally reflect first from surface 12 at an angle not normal with the plane of major surfaces 10A, 10B so that the beam ray would then take multiple internal reflections between surfaces 10A, 10B as it propagates across the prism device 10 parallel to front side surface 16 until the beam ray reaches surface 14. At surface 14, which is disposed at an angle not normal to the planes of major surfaces 10A, 10B, the beam ray is again reflected, this time in a direction toward front side surface 16 where it exits from output surface 16B. Such a ray trace will be described in more detail later relative to FIGS. 10–13.

Hypotenuse front edge surface 16 of beam reconfiguring device 10 is both the input and output surface or face for multiple radiation beams 17 to be optically reconfigured by device 10. In the embodiment as shown surface portion 16A is an input surface and surface portion 16B is an output surface. Input surface 16A receives as input multiple beams 17 having cross sectional asymmetric beam images 17A with a major axis in one orthogonal direction that is significantly longer than its minor axis in the other orthogonal direction. In the case of a semiconductor laser array source, the major axis alignment of the individual asymmetric beam images are abreast, i.e., in a straight line along axis 16C parallel with front surface 16. Due to internal reflections within prism device 10 causing dissection, lateral reconfiguration and orientation of images 16A, their replacement as new individual asymmetric, reconfigured beam images 19A as output multiple beams 19 are rotated so that the major axis of new asymmetric beam images 19A are now substantially perpendicular to image axis 16A as illustrated in FIG. 1. In other words, the individual aperture images 17A have, in essence, been reconfigured to be aligned parallel with each other rather than abreast of one another. The parallel alignment at output 19 renders it much easier to optically converge these asymmetric, reconfigured images for focusing to a final single beam that is substantially symmetric, which is a suitable delivery form for optical components requiring symmetric input beams for efficient transfer and coupling of substantially all beam intensity, brightness and power, for example, an optical fiber.

The foregoing description describes radiation beam input via input surface 16A and resulting displaced and redistributed output at output surface 16B. However, it will be understood by those skilled in optics that the input surface can be surface portion 16B and the output surface will then be surface portion 16A resulting in the new individual asymmetric beam images 19A as output multiple beams 19 at surface portion 16A rather than surface portion 16B.

An example of the dimensions of prism device 10, relative to a semiconductor array that provides for 10 in-line emitters and output beams, is a length of 20 mm for front face 16 and the distance between apex 18 and front face 16 is, therefore, one-half of the tangent of 35.26° times the length of the front length, or about 7.07 mm, and a thickness, D, of 0.5 mm.

Reference is now made to FIGS. 3 and 4 illustrating a second embodiment of this invention which is very similar in nature to the first embodiment except for the angular placement of one of the lateral side edges. Beam reconfiguring device 20 comprises a prism element, which is made from glass or other suitable, conventionally employed optical lens material. Device 10 is triangular in shape and, in particular comprises a prism shape having major opposite planar surfaces 20A and 20B and side edge surfaces consisting of lateral side edge surfaces 22 and 24 and a hypotenuse front edge surface 26. Lateral side edge surfaces 22 and 24 have one end that meet with hypotenuse front edge surface 26 and an other end that meet together to form apex 28. In the particular embodiment shown, lateral edge surfaces 22 and 24 are, however, disposed at an angle relative to the planar extent of major surfaces 20A, 20B. Thus, as shown in FIG. 4, surfaces 22 and 24 are disposed at angles 60° and 120° relative to axis 21 which is normal to the planar extent of major surfaces 20A, 20B. Surfaces 22 and 24 form angles 23 and 25 where they meet with surface 26. In the particular example here, angles 23 and 25 are both shown at 45°. Angle 23 of surface 22 is 45° counterclockwise relative to axis 21 whereas angle 25 of surface 24 is 45° clockwise relative to axis 21, i.e., angle 23 is basically a complement angle of angle 25. As in the case of the previous embodiment, other combination of angles of lateral side edge surfaces 22, 24 that provide the function of beam orientation are possible.

A beam ray entering input surface 26A of prism device 20 will internally reflect first from surface 22 at an angle not normal with the plane of major surfaces 20A, 20B so that the beam ray would then take multiple internal reflections between surfaces 20A, 20B as it propagates across the prism device 20 parallel to front side surface 26 until the beam ray reaches surface 24. At surface 24, which is disposed at an angle not normal to the planes of major surfaces 20A, 20B, the beam ray is again reflected, this time in a direction toward front side surface 26 where it exits from output surface 26B. Such a ray trace will be described in more detail later relative to FIGS. 10–13.

Hypotenuse front edge surface 26 of beam reconfiguring device 20 is both the input and output surface or face for multiple radiation beams 27 to be optically reconfigured by device 10. In the embodiment as shown surface portion 26A is an input surface and surface portion 26B is an output surface. Input surface 26A receives as input multiple beams 27 having cross sectional asymmetric beam images 27A with a major axis in one orthogonal direction that is significantly longer than its minor axis in the other orthogonal direction. In the case of a semiconductor laser array source, the major axis alignment of the individual asymmetric beam images are abreast, i.e., in a straight line along axis 26C parallel with front surface 26. Due to internal reflections within prism device 20 causing dissection, lateral reconfiguration and orientation of images 26A, their replacement as new individual asymmetric, reconfigured beam images 29A as output multiple beams 29 are rotated so that the major axis of new asymmetric beam images 29A are now substantially perpendicular to image axis 26A as illustrated in FIG. 3. In other words, the individual aperture images 27A have, in essence, been rotated to form new images that are aligned parallel with each other rather than abreast of one another. The parallel alignment at output 19 renders it much easier to optically converge these asymmetric, reconfigured images for focusing to a final single beam that is substantially symmetric, which is a suitable delivery form for optical components requiring symmetric input beams for efficient transfer and coupling of substantially all beam intensity, brightness and power, for example, an optical fiber.

In the foregoing embodiments of this invention as well as later described embodiments, an important result of this invention is that the etendues, which are the aperture-times-divergence products in orthogonal directions of the output beam from beam reconfiguring device 10 or 20, will be more nearly equal than the etendues in orthogonal directions of the input beam.

The foregoing description describes radiation beam input via input surface 26A and resulting displaced and redistributed output at output surface 26B. However, it will be understood by those skilled in optics that the input surface can be surface portion 26B and the output surface will then be surface portion 26A resulting in the new individual asymmetric beam images 29A as output multiple beams 29 at surface portion 26A rather than surface portion 26B.

After review of the foregoing embodiments by one skilled in the art, it will be realized that the structure of beam reconfiguring device 10 or 20 is basically four reflective surfaces angularly positioned relative to one another. In connection with device 10, the four reflective surfaces are surfaces 12, 10A, 10B and 14. Surfaces 10A, 10B are positioned in parallel to one another while surfaces 12 and 14 are disposed at angles 60° or 120° with respect to surfaces 10A, 10B. In operation, therefore, these reflective surfaces could be spatially set up relative to each other without a prism structure. As an example, the structure of international application No. PCT/GB94/022614, comprising two spatial reflective surfaces, could be further modified to include spatially related reflective surfaces at appropriate angles 13, 15, and φ.

Moreover, one of the lateral side surfaces 14 could be eliminated so that the structure comprising three spatially disposed reflective surfaces 10A, 10B and 12 remain and the attributes of this invention would be achieved, the only difference being that the output beam 19 will not be fully rotated 90° and exit at an angle that is similar to the entrance angle of the input beam 17 directed to reflective surface 12. However, the output beam will be reconfigured, i.e., it will be redistributed and segmented from the original input beam with aligned orientation in a different direction with beam rotation less than 90°. Also, the etendue, i.e., the aperture-times-divergence product, in orthogonal directions of the output beam will be more nearly equal than the etendue in orthogonal directions of the input beam.

In both of the foregoing embodiments, lateral side edge surfaces 12, 14; 22, 24 may be provided with metal or dielectric coatings to enhance internal reflectivity from these surfaces.

Beam reconfiguring device 30 in FIGS. 5 and 6 is identical to device 10 in FIG. 1 except that lateral side edges 12, 14 do not meet at apex 18, but rather are coupled to a rear flat edge surface 31 which is substantially parallel with front edge surface 16. The inclusion of back edge surface 31 in the prism element renders the internal reflection path for beam rays of input beams 17 through the prism interior to be longer in length and, therefore, provide for additional internal reflections between surfaces 10A, 10B which will be evident from description later relative to FIGS. 10–13. This extended beam path length provides in addition for greater physical separation between input surface 16A and output surface 16B, while any residual beam divergence is confined by reflection off of surfaces 31 and 16 which is desirable.

It is important that edges of the prism devices 10 and 20 are not rounded which can particularly occur in their handling during polishing of major opposite surfaces 10A, 10B; 20A, 20B. Such corner or edge rounding occurs when the prism major opposite surfaces are polished which provides a tendency to round off edges of the prism. These surfaces require polishing to insure optimum internal reflection of the beam radiation as it propagates internally of the prism between these two surfaces. The rounded edges of the prism can affect the quality of the reconfigured output beams caused by light scattering within the prism. This rounding can be eliminated by utilizing the structure shown in FIGS. 7 and 8 which structure also provides a means for handling of the prism without contact and for positioning of the prism structure within an optical delivery system.

As shown in FIGS. 7 and 8, complimentary pieces 10C and 10D may be added to sides of prism device 10 during the polishing operation for major sides 10A and 10B. Complementary piece 10C is provided on one side of device 10 and complementary piece 10D is provided on the other side of device 10, and these pieces overlap at 10E to form an adjoining edge 18A. Complementary pieces 10C and 10D aid in preventing the undesired polishing of corners or edges of faces 12, 14, 16 with surfaces 10A and 10B. Rounding of these edges will cause internal radiation scattering leading to undesirable losses. Complimentary pieces 10C and 10D are also helpful in the handling and the mounting of prism device 30 in an optical delivery system. Lateral side edge surfaces 12 and 14 are coated with silver or other high reflecting material, such as a metal or dielectric material, to insure high surface reflection since these surfaces are in direct contact with complement side edge surfaces 12C and 14C of pieces 10D and 10C.

Reference is now made to FIG. 9 to explain the structural origin of the prism device 20 according to this invention. In FIG. 9, a right-angle prism 32 is shown which has two equal lateral sides 34 connected to a hypotenuse side 35 and end faces 36 and 37. Sides 33 and 34 intersect each other at one end at 90° while they intersect with hypotenuse side 35 at 45° at their other ends. If an image 35A is provided as input through hypotenuse surface 35, image 35A will be internally reflected from surface 33, thence from surface 34 and return through hypotenuse surface 35 as mirror image 35B of original image 35A, i.e., image 35A will be flipped 180° about the axis of prism device 20. If the major axis of image 35A is inclined by 450 to the axis of prism device 32, the reflected image 35B will be rotated by 90° with respect to the major axis of image 35A. If, however, a diagonal triangular section is formed through roof prism 32, as illustrated by dissecting lines 38 and 39 extending entirely through the body of prism 32, a configuration identical to that of the first embodiment shown in FIG. 1 is created. Input images will not now be merely a mirror image, but rather will be dissected into segments, reconfigured and rotated 90° with respect to lines 38 and 39 due to both angularly disposed edge surfaces 36A and 37A as well as multiple internal reflections created between dissecting surfaces 38 and 39 while traversing between mirror edge surfaces 36A and 37A. As shown in FIG. 9, input images 35A will be angularly reflected not only at dissecting surfaces 36A and 37A but also be periodically, angularly reflected between dissecting surfaces 38 and 39 so that resulting output images 35C will not only appear to be flipped but also will be rotated in the input/output plane by 90°.

Reference is now made to FIGS. 10–13 showing different schematic illustrations of the beam rays of multiple input beams propagating through the prism device of this invention in order to explain how they undergo dissection, displacement and rotation producing new output beams having equalized etendues. In FIGS. 10–12, a visual concept is illustrated by means of ray traces of input beam rays which may make multiple internal reflections within prism device 10, as previous described. As an example, consider two dimensional input ray traces A1, A2, B1, B2, C1, C2, D1, D2, E1 and E2. As shown in FIGS. 10 and 11, input ray pairs A1 & A2; B1 & B2; C1 & C2; D1 & D2; E1 & E2; and F1 & F2 have vertically aligned inputs as they enter input surface 26, i.e., these beams are taken as pairs entering surface 16 at different elevations relative to thickness, D. Take, in particular, two different rays A1 & A2 for tracing observation entering input face 16 in vertically aligned relation, particularly with reference to FIG. 11. Because of the angular disposition of reflecting lateral edge surface 12 and the positional relationship relative to their entrance into front side face 16, ray A2 reaches an bottom portion of lateral side surface 12 and is reflected from lateral side surface 12 in advance of ray A1 which reaches a upper portion of side surface providing a slightly longer path length. Rays A1 and A2 then traverse the prism bulk parallel with input/output face 16 respectively making multiple periodic internal reflections respectively along line traces 16D, 16E between surfaces 10A and 10B, as shown in FIGS. 11 and 12, until they arrive at lateral side surface 14 in a manner that they are both reflected from a bottom region of surface 14 as seen in FIGS. 11 and 12. Since rays A1 and A2 have taken different paths of propagation of different lengths, they will undergo a different number of reflections along different reflection paths between surfaces 10A and 10B. In the particular case here, rays A1 and A2 both reach the upper portion of side surface 14, due to different multiple reflection periods between surfaces 10A, 10B, so as to be reflected in about the same horizontal plane through surface 16, as illustrated in FIG. 12. As a result, the positional relationship of beam rays A1 and A2 have been reconfigured relative to their origin in that they have been displaced in different planes with a different displacement or distribution in the plane of observation within a particular segment comprising, in this example, the group of rays A1, A2, B1 and B2 representative of the segment, and the group of rays C1, C2, D1 and D2 representing the next adjacent such segment and so on. The dimension of these beam segments in the lateral or x axis direction (FIGS. 11 and 12) is determined by the thickness, D, of prism device 10. We refer to this combined process of displacement and rotation within partitioned segments as "reconfiguration" of the original input beam. When observing traces A1 & A2 with adjacent traces for rays B1 & B2, it can be seen that, when observed as a four-point group, these traces have undergone a 90° rotation, as well as flipped, in the plane of observation.

With reference to FIG. 11A, for rays traveling along the optical axis, such as ray A in FIG. 10A, the prism operates in the manner as previously explained in connection with the rays traced in FIGS. 10–12. However, for rays propagating at small angles relative to optical axis A, such as demonstrated by ray B, some rays may be deviated at angles inclined to the horizontal, away from the optical axis. Such deviated rays B will strike and internally reflect from surface 16 at grazing incidence and be redirected back into the prism and ultimately exit the prism within the aperture of face 16B and divergence of the remainder of the beam. Similarly, surfaces 12 and 14 also direct beams striking them at glazing incidence back into output beam 19. In this connection, surface 31 in FIGS. 5 and 6 will function the same way in handling these deviated rays B.

Thus, as best shown in FIG. 13, these ray traces, representative of asymmetric input beams 17A with a major beam axes 17B aligned along the same axis 16C, will produce new, reconfigured asymmetric output beams or beamlets 19A within segments 19C having major beam axes 19B substantially perpendicular to input major axes 17B. Segments 19C are made up of beam ray traces that have been displaced or redistributed within dissected image segments 19C producing new beam asymmetric images 19A with their major axes 19B all aligned perpendicular along axis 16C and rotated 90° with respect to imaginary input image segments 17C, the lateral extent of these segments dependent upon prism thickness, D.

Reference is now made to FIGS. 14 and 15 which illustrate a fourth embodiment of this invention. Beam reconfiguring device 40 has lateral side edge surfaces 12 and 14 partitioned in two angular surfaces 12A, 12B; 14A, 14B which are disposed from the plane of major opposite surfaces 10A, 10B by an angle equal to 60° and 120° and are at 90° with respect to each other. In this embodiment the beam rays are reflected from surfaces 12A, 12B; 14A, 14B in the same manner as in the case of surfaces 12 and 22 in the respective embodiments of FIGS. 1 and 3.

A fifth embodiment is shown in FIG. 16. Beam reconfiguring device 42 in the case here has the same lateral side surfaces 12, 14 as in FIG. 1 except that the angle, φ, of major prism surfaces 10A, 10B may be chosen to be different from 35.26°, i.e., it may be chosen arbitrarily with the other angles φ and σ of the surface being correspondingly changed with its selection. The input and output beams will now enter and exit surface 16 at an angle matching the refraction angle required for throughput.

In FIG. 17, a sixth embodiment is illustrated comprising beam reconfiguring device 44. This embodiment is similar to the embodiment of FIG. 16 wherein the front face is disposed at an angle other than 45°. In the case of FIG. 17, a portion of front face 16, input face 46A, is disposed at an angle, φ, and another portion of front face 16, output face 46B, is disposed at angle, ζ, that may be different from the angle, φ. Therefore, front face 16 has a convex-like contour and the input and out beam enter and exit faces 46A and 46B, respectively, at an appropriate refractive angle.

In FIG. 17, input/output faces 46A, 46B are formed so that they form a convexlike contour, i.e., faces 46A, 46B are angularly disposed behind front face 16. However, the opposite or antithesis is also an alternative, as shown in FIG. 17A, where enter and exit faces 46A and 46B form a concave-like contour, i.e., faces 46A, 46B of device 44' are angularly disposed in front of front face 16. Again, input face 46A, is disposed at an angle, φ, and output face 46B, is disposed at angle, ζ, which may be different from the angle, φ.

It will be understood by those skilled in the art that any of the embodiments shown above may be combined with other optical elements such as prisms and/or lenses into an optical assembly or optical handling system, either by cementing these elements to the prim element or by monolithically fabricating the prism element as part of such an assembly or system.

Reference is now made to FIG. 18 that illustrates a optical handling system for use in conjunction with beam reconfiguring device 30 of FIG. 5. The FIG. 5 arrangement is employed to provide sufficient lateral space for the optics. As shown in FIG. 18, the asymmetrical beam output from as semiconductor laser array 41 is efficiently coupled into a core or an inner cladding of optical fiber 47. The multiple asymmetrical output beams from the individual emitters of array 41 are permitted to fill the far field and are presented to a first of two lens, cylinder lens 43A, functioning as a collimator in the fast axis, i.e., light collection in the transverse direction. The second lens, cylinder lenslet array 43B, functions as a collimator in the slow axis direction, i.e., light collection in the lateral direction. The collected light then enters input face 16A of prism 30, is processed by prism 30, and exits output face 16B and is received by cylinder lens 45A and 45B that, respectively, narrow the field spacing of reconfigured beamlets, such as shown at 19A in FIG. 13, as a close pack resulting beam and focus this resulting beam to a spot size substantially compatible with the input aperture and NA of optical fiber 47. Other configurations of lenses known to those skilled in the optics art can fulfill the function of lenses 43A, 43B; 45A, 45B.

The optical handling system shown in FIG. 19 is the same as that shown in FIG. 18, except for the input laser source, which is shown here a single laser source 48, so that the description of FIG. 18 is equally applicable to FIG. 19 except for single cylinder lens 49. The output beam from source 48 is asymmetrical so that the optics including beam reconfiguring device 30 is employed to reconfigure the single beam into a resulting beam that is more symmetrical and substantial matching of the aperture and NA of fiber 47.

Reference is now made to FIG. 20 illustrating the application of the beam reconfiguring device 20 of this invention in the optical handling system 50. The embodiment of FIG. 20 permits straight line throughput of input beams via prism device 20 and, further, includes optical preparation of the input radiation beams, alternatives of which are more specifically disclosed in FIGS. 21–24. In FIG. 20, a plurality of radiation beams 52A are provided from semiconductor laser array or laser bar 51 having a plurality of laser stripes 57. The output radiation beams 52A, as previously explained, are highly asymmetric and are highly divergent in the fast or transverse direction so that the emitted radiation requires at least some collimation in the transverse plane for efficient coupling of the radiation. This is traditionally accomplished by means of cylinder lens 53 that collimates the transverse axis of the output beam. This is followed by optical beam filling plate 54 which is a beam filling lens. The far field of the individual emitted beams from laser bar 51 should be beam filled to provide a uniform far field radiation field for coupling into system 50.

In order to have straight throughput via prism device 20, two right angle prisms, input prism 55 and output prism 56, are provided respectively as beam input and beam output devices for prism device 20. Prisms 55, 56 are cemented to front surface 26 by means of conventional optics adhesive. As can be seen from FIG. 20, beams 52A entering input prism 55 are transposed 90° into an input face portion of front face 26 and thereafter displaced and redistributed via surfaces 20A, 20B, 22 and 24 providing an output at output face portion of front face 26 into output prism 56 where the reoriented images of new beams 52B are transposed 90° to provide an output that is substantially parallel and aligned with the input to system 50 from laser bar 51. Thus, the result is a straight in-line optical system 50 with no loss of brightness of input beams 52A with equalized etendues, at the output. The aspect ratio of output beams 52B are also different and they can be also equalized by replacing output prism 56 with a correcting optical system, such as the anamorphic prism pair shown in FIG. 5 of U.S. Pat. No. 5,369,661, discussed earlier or with the converging prism structure shown in FIG. 25, to be discussed later, or with other systems well known in the art.

Reference is now made to FIGS. 21 and 22 showing one embodiment for the cylinder lens array 53 and beam filling optics 54 of FIG. 20. The asymmetric output of the laser array requires some collimation in the fast axis or transverse direction which is accomplished by cylinder lenses for collimating the beams. The slow axis or lateral direction requires a precision array of adjacently aligned cylinder lenses. This arrangement can be accomplished by diffractive or refractive lenses. Semiconductor laser array 66 in FIG. 21 comprises a plurality of laser device that are master oscillator power amplifiers (MOPA's) comprising stripe regions 67 which are pumped to function as a laser and diverging gain regions 68 which are biased to provide additional gain to the developed high power laser output to produce beams 62 of high power content. The output of beams 62 are divergent in both the lateral direction (FIG. 21) as well as in the transverse direction (FIG. 22) so that lens system 60 provides orthogonal quasi-collimation. Lens system 60 comprises an array of input cylinder lens 63 extending in the transverse direction, one for each laser emitter, for collimating the radiation in the lateral direction and a single output cylinder lens 64 extending in the lateral direction for collimating the radiation in the transverse direction. By varying the focal length of the curvature of cylindrical lens 63, quasi-collimator 60 can collimate the beam to any selected height in the transverse direction. Output 69 is then provided as input to a reconfiguring system such as prism device 10 or 20 or to an optical handling system 50 as shown in FIG. 20. Other laser sources, beside MOPAs, e.g., unstable resonator or multimode laser sources, are also possible.

In FIGS. 23 and 24, another embodiment is shown for the cylinder lens array 53 and beam filling optics 54 of FIG. 20. Semiconductor laser array 76 comprises a plurality of laser stripes 77 forming output beams 72 collimated by individual cylinder lenses 73 of lens system 70. The asymmetric output of the laser array requires some collimation in the fast axis or transverse direction which is accomplished by cylinder lenses 73. The slow axis or lateral direction requires a precise alignment of adjacently aligned cylinder lenses. This arrangement can be accomplished by a discrete array of cylindrical lenses 73 which are comparatively inexpensive. Lens system 70 further comprises a lens support holder 78 having pairs of concave-shaped cradle regions 75 to receive the curved portion of a single cylinder lens 73 for proper alignment relative to the spacing of stripes 77 of laser array 76. The cradle supports 75 provide for proper maintenance of the center-tocenter spacing of lenses 73 relative to stripes 77 despite variations in their lens size, which is typical among such cylindrical lenses. Support holder may be made of silicon and machined or etched to provide lens cradle regions 75. As best seen in FIG. 23, cradle regions 75 are in pairs at opposite ends of slot 74 so that output 79 from cylinder lenses 73 proceeds through slot 74 to a beam reconfiguring system such as prism device 10 or 20 or to an optical handling system 50 as shown in FIG. 20.

Reference is now made to FIG. 25 which illustrates a converging lens system 80 for equalizing the aspect ratio of the output beam 52B from the beam reconfiguring device of this invention, such as from optical handling system 50. Lens system 80 comprises a slab optics element having converging sides 81 and an input end 82 of cylinder lens shape to collect the radiation and optically converge the light to an output 84 forming a substantially symmetrical spot for delivery to a symmetrical apertured device such as an input end of an optical fiber.

In FIG. 26, the converging lens system 90 accomplishes 90° transposition of input beam 52B from reconfiguring system 50 as may be desirable for particular applications. Lens system 90 is a slab optics element comprising two sections, right angle prism section 92 and converging section 96 similar to lens system 80 in FIG. 25. Right angle prism section 92 has for its hypotenuse side edge surface a convex curved surface 94 that provides a totally internal reflection lens surface for redirecting and converging the beams into converging lens section 96 forming a substantially symmetrical spot for delivery to an optical delivery system, such as an optical fiber.

A particular application for converging lens system 90 of FIG. 26 is illustrated in FIGS. 27 and 28, which is basically a combination of the optical lens systems of both FIGS. 20 and 26. The same numerical identification is, therefore, used in these figures so that the description from FIGS. 20 and 26 is equally applicable in reference to FIGS. 27 and 28. The result accomplished is a completely in-line, throughput beam system where the beam output from lens 67 is provided as input to optical fiber 99. The three optical components comprising prism 55, beam reconfiguring device 20 and converging lens system 90 are relatively easily fabricated, polished (including curved lens surface 94) and cemented together without requiring labor intensive alignment, i.e., they do not have to be optically aligned one relative to another since their precise dimensions require only that they be physically aligned when cemented or otherwise integrated together. The most critical alignment required is laser array 51, lenses 53 and 54. All reflections are internal in the combined components 55, 20, 90 so that almost 100% of the radiation is conserved with no brightness loss from system input to system output to fiber 99.

Reference is now made to FIG. 29 which discloses an optical system for vertically aligning or stacking of a plurality of originally abreast asymmetric beam outputs from a plurality of separate semiconductor laser arrays. This vertical stacking provides for a combined output beam that may be square or rectangular in the far field eliminating any possibility of "dead space", i.e., no full beam filling, between combined laser array beam outputs. It is preferable, but not required, particularly in cases where large power inputs are required, to vertically stack the laser array combined output beams for presentation as input to input surface 16A or 26A of beam reconfiguring devices 10 and 20. As shown in FIG. 29, this can be accomplished by prism stack system 100 comprising a stack of right angled prisms 102, 104, 106 and 108, one for each laser array combined output beam 101, 103, 105 and 107. Prisms 102, 104 and 108 are increasing length to accommodate lateral positioning of laser array components 110, 112, 114 and 116 (shown in FIG. 30) to be conveniently offset from one another. The resultant output of laser array combined output beams 101, 103, 105 and 107 is a vertically aligned stack at output face 109 of prism system 100.

In FIG. 29, the entry point for laser array combined output beams 101, 103, 105 and 107 is from one side of prism system 100 so that angled internal reflecting surfaces 102A, 104A, 106A and 108A are parallel with one another. However, as illustrated in FIG. 30, the entry points of these output beams may from opposite sides of prism system 100. This is accomplished by flipping over prism plates 102 and 106 in the stack so that their internal reflecting surfaces 102A and 106A are properly aligned to receive respective laser array combined output beams 101 and 105 from laser array components 110 and 112. Each laser array component comprises a laser bar 120 mounted on a heat sink in housing 122. The array output beam is quasi-collimated and beam filled by cylinder/beam filling optics 124. To be noted in connection with the stacked output beams 101, 103, 105 and 107 from stacked prism output face 109 is that the total aspect ratio of these output beams can be equalized in both orthogonal directions (transverse and lateral) by providing a sufficient number of stacked beams that provides an output at output 109 that is of substantially of square aperture and square divergence. This square output can be matched to a round fiber input by matching the diagonal of the square beam output to the aperture of the fiber and by matching the diagonal divergence of the square beam output to the numerical aperture of the fiber using appropriate focusing optics.

The stacked beam output from output surface 109 can be provided as input to the beam reconfiguring device of this invention. This is illustrated in FIG. 31 for two laser array components 110, 112 with laser array combined output beams 101A and 103A employing right angle prisms 102, 104 providing a two stacked level of laser array combined output beams 101B, 103B. Beams 101B, 103B are reconfigured in the same manner as previously described via beam handling and reconfiguring system 50 to produce an array of transversely aligned beams 130 for focusing to an optical delivery system, such as an optical fiber.

Reference is now made to FIG. 32 which discloses a modified device 10' of the beam reconfiguring device 10 of FIG. 1 forming a retro-reflector. As show in FIG. 32, retro-reflector prism device 10' is formed from a one-half portion of beam reconfiguring device 10. The input beam 130 into face 26' is reflected from reflective surface 12A and returns through face 26' as output beam 132 with its divergence and polarization rotated 90°. Since retro-reflector prism device 10' rotates polarization, input and output beams 130, 132 can share the same optics. This is illustrated in FIG. 33 where broad area laser 121 provides a beam 130 for input to retroreflector prism device 10' via polarizer beam splitter 123 and fast and slow cylinder lenses 122 and 124. The beam is reflected from surface 12A and returns as beam 132 with rotated polarization that is reflected at beam splitter face 127, sensitive to polarization orientation of the radiation, to cylinder lens 125 and focused to a spot for input into optical fiber 126.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. A beam reconfiguring device for an optical beam comprising:

two reflecting surfaces which are substantially parallel;

at least one angled reflecting surface disposed at an angle to said two reflecting surfaces;

an input for entry of said optical beam in the device;

an output for exit of said optical beam from the device;

said angle determined such that at least a portion of said optical beam travels along a path, a portion of said beam is substantially parallel to said two reflecting surfaces, and said beam after entry into the device is divided into a plurality of separate beam segments via said reflecting surfaces such that any respective segment of said beam at the device output is effectively rotated about a direction of propagation of the optical beam as provided at the input.

2. The beam reconfiguring device of claim 1 wherein said angled reflecting surface is also disposed at an angle to the direction of propagation of said optical beam via said input.

3. The beam reconfiguring device of claim 1 wherein there are at least two angled reflecting surfaces disposed at an angle to said two reflecting surfaces and respectively at opposite ends of said two reflecting surfaces.

4. The beam reconfiguring device of claim 3 wherein said two angled reflecting surfaces are also disposed at a dihedral angle with respect to said two reflecting surfaces.

5. The beam reconfiguring device of claim 3 wherein a dihedral relationship between said two angled reflecting surfaces and said two reflecting surfaces comprises a prism.

6. The beam reconfiguring device of claim 3 wherein all of said reflecting surfaces provide reflection via total internal reflection.

7. The beam reconfiguring device of claim 1 wherein said at least one angled reflecting surface and said two reflecting surfaces are independent mirror surfaces spatially disposed relative to each other.

8. The beam reconfiguring device of claim 1 wherein said at least one angled reflecting surface and said two reflecting surfaces are surfaces of a prism element.

9. The beam reconfiguring device of claim 8 wherein there are two angled reflecting surfaces in said prism disposed at an angle to said two reflecting surfaces; said two angled reflecting surfaces coupled to said two reflecting surfaces.

10. The beam reconfiguring device of claim 1 wherein said optical beam is from a multiple semiconductor laser.

11. The beam reconfiguring device of claim 1 further comprising a lens to collimate said input beam in at least one orthogonal direction transverse to the direction of beam propagation.

12. The beam reconfiguring device of claim 1 further comprising a lens aligned to receive said input beam;

said lens having a first surface comprising a plurality of cylindrical powered input surfaces aligned in a first direction; and an opposite surface comprising a cylindrical shaped surface aligned in a second direction.

13. A beam reconfiguring device for an optical beam comprising:

an element having a plurality of reflecting surfaces for receiving said optical beam along an optical path among said reflecting surfaces, two of said reflecting surfaces being substantially parallel and at least one other reflecting surface disposed at an angle to said two reflecting surfaces;

an input for entry of said optical beam in the device;

an output for exit of said optical beam from the device;

said beam upon entry in the device having its largest spatial dimension transverse to its direction of propagation lying in a plane parallel to said two reflecting surfaces;

said angle being such that said beam is converted into a plurality of beam segments at said output having substantially equalized orthogonal etendues.

14. The beam reconfiguring device of claim 13 wherein there are two angled reflecting surfaces disposed at an angle to said two reflecting surfaces; said two angled reflecting surfaces being located at opposite ends of said two reflecting surfaces.

15. The beam reconfiguring device of claim 14 wherein said output beam has a its largest spatial dimension transverse to its direction of propagation lying in a plane perpendicular to said two reflecting surfaces.

16. A beam reconfiguring device comprising:

a prism element having opposite major planar surfaces and two lateral side edge surfaces comprising internal reflecting surfaces;

said lateral side edge surfaces each connected at one of their ends to a front edge surface, said lateral side edge surfaces disposed at an angle relative to an axis normal to the planar extent of said opposite major planar surfaces;

a first portion of said front edge surface comprising an input for an original input beam and a second portion of said front edge surface comprising an output for an output beam as reconfigured via said internal reflecting surfaces;

said reconfigured output beam comprising a plurality of beam segments of the original input beam each segment having redistributed and reoriented rays of said original input beam via said internal reflecting surfaces with substantially equalized etendues.

17. The beam reconfiguring device of claim 16 wherein said lateral side edge surfaces are disposed at an angle of 45° relative to said axis.

18. The beam reconfiguring device of claim 17 wherein said lateral side edge surfaces are respectively disposed at the same angle of 45° relative to said axis.

19. The beam reconfiguring device of claim 17 wherein said lateral side edge surfaces are respectively disposed at an angle of +45° and −45° relative to said axis.

20. The beam reconfiguring device of claim 16 wherein said lateral side edge surfaces are divided into two portions each disposed at an angle of 45° relative to said axis and at 90° relative to each other.

21. The beam reconfiguring device of claim 16 wherein said input beam is received from a semiconductor laser array.

22. The beam reconfiguring device of claim 16 wherein said input beam is received from a laser source comprising a single beam.

23. The beam reconfiguring device of claim 16 wherein the other ends of said lateral side edge surfaces meet at an apex.

24. The beam reconfiguring device of claim 16 wherein the other ends of said lateral side edge surfaces meet at an angle with a surface which is substantially parallel with at least a portion of said front edge surface.

25. The beam reconfiguring device of claim 16 wherein said first and second front edge surface portions are disposed at an angle relative to a remaining portion of said front edge surface.

26. The beam reconfiguring device of claim 16 wherein radiation portions of said input beam are redistributed within said segments so that a final output beam of any such segment is a mirror image of a portion of an original image rotated 90°.

27. The beam reconfiguring device of claim 16, wherein radiation portions of said input beam are redistributed within said segments so that a final output beam of any such segment is a portion of an original image rotated 90°.

28. A beam reconfiguring device for a plurality of aligned original radiation beams having a major orientation, comprising:

a prism having a plurality of reflecting surfaces defining a plurality of different propagation paths for said beams internally through said prism, each of said paths involving multiple reflections between said reflecting surfaces;

said beams entering said prism being dissected into a plurality of beam segments due to said different propagation paths concurrently with rotation of said beam segments about their direction of propagation so that said beam segments are reconfigured from their original beams into a plurality of separate new beams with each having a rotated orientation about their direction of propagation different from said major orientation.

29. The beam reconfiguring device of claim 28 wherein the different orientation is a segment rotation of 90°.

30. The beam reconfiguring device of claim 28 wherein a final output beam of any of said beam segments is a mirror image of a portion of an original image rotated 90°.

31. The beam reconfiguring device of claim 28 wherein a final output beam of any of said beam segments is a portion of an original image rotated 90°.

32. The beam reconfiguring device of claim 28 wherein said beams are received from a semiconductor laser array.

33. The beam reconfiguring device of claim 28 wherein said beams are received from a laser source comprising a single beam.

34. A beam reconfiguring device for a plurality of aligned original radiation beams each having a major axis aligned in a first direction, comprising:

a prism beam reconfiguring device having at least two sets of reflecting surfaces defining a plurality of different propagation paths for said beams internally through said prism device;

said beams entering said prism beam reconfiguring device being dissected into beam segments by one of said reflecting surface sets via said different propagation paths concurrently with rotation of said beam segments so that said beam segments are reconfigured from said original beams into a plurality of new beams with each having a major axis in a second direction.

35. The beam reconfiguring device of claim 34 wherein said first direction is perpendicular with respect to said second direction.

36. A beam reconfiguring device for a plurality of aligned original radiation beams each having a major axis aligned in a first direction, comprising:

a prism beam reconfiguring device having at least two sets of reflecting surface pairs defining a plurality of different propagation paths for said beams internally through said prism device;

a first set of reflecting surface pairs comprising major opposite surfaces of said prism beam reconfiguring device, said surfaces being spatially disposed in parallel alignment with one another and having a distance comprising a thickness of said prism beam reconfiguring device;

a second set of reflecting surface pairs comprising respective lateral side edge surfaces of said prism beam reconfiguring device connected at one end thereof to a hypotenuse front edge of said prism beam reconfiguring device, said lateral side edge surfaces disposed at an angle relative to an axis normal to said major surfaces so that said edge surfaces are either angularly disposed on the same side or respectively on opposite sides of said axis;

a first portion of said prism beam reconfiguring device front edge comprising an input surface for said aligned original radiation beams and a second portion of said front edge comprising an output surface from said prism beam reconfiguring device;

said original radiation beams undergoing reconfiguration wherein the beams are redistributed and reoriented through multiple reflections within said prism beam reconfiguring device via said reflecting surface pairs into new radiation beams each having major axis aligned in a second direction.

37. The beam reconfiguring device of claim 36 wherein said second direction is substantially orthogonal with said first direction.

38. The beam reconfiguring device of claim 36 wherein said original radiation beams have their major axis aligned along a plane parallel with said prism beam reconfiguring front edge and said new radiation beams have their major axis aligned substantially perpendicular to said plane due to said reconfiguration.

39. A beam reconfiguring device for a plurality of radiation beams each of high aspect ratio with a major axis orientation comprising:

a prism element with two major opposite planar, substantially parallel surfaces and a hypotenuse front edge surface and two equal lateral side edge surfaces, a first portion of said front edge surface constituting an input surface and a second portion of said front edge surface constituting an output surface;

said side edge surfaces disposed at an angle relative to said major planar surfaces such that, when said beams are positioned for entering through said first portion of said front edge surface, said beams are internally reflected from a first of said side edge surfaces and propagate through said prism element substantially parallel to said front edge surface in a periodic internally reflected manner between said major planar surfaces and, thence, internally reflected from a second of said side edge surfaces and exiting through the second portion of said front edge surface;

said radiation beams entering said prism element through said input surface optically divided into a plurality of beam segments having segment lengths proportional to the spatial distance between said prism major planar surfaces, said optically divided segments being rotated about their direction of propagation and exiting as reconfigured beams through said output surface with an axis orientation different from said major axis orientation.

* * * * *